United States Patent [19]

Sidles

[11] Patent Number: 5,166,615

[45] Date of Patent: Nov. 24, 1992

[54] SYSTEM FOR DETECTING NUCLEAR MAGNETIC RESONANCE SIGNALS FROM SMALL SAMPLES

[75] Inventor: John A. Sidles, Seattle, Wash.

[73] Assignee: The Board of Regents of the University of Washington, Seattle, Wash.

[21] Appl. No.: 654,961

[22] Filed: Feb. 11, 1991

[51] Int. Cl.[5] ............................................. G01R 33/20
[52] U.S. Cl. .................................................... 324/307
[58] Field of Search ........ 128/420 A, 653 A, 653 SC; 324/300, 307, 309, 310, 311, 312, 313, 318, 322

[56] References Cited

U.S. PATENT DOCUMENTS 4,889,526 12/1989 Rauscher et al. ................ 128/420 A Primary Examiner—Michael J. Tokar
Attorney, Agent, or Firm—Christensen, O'Connor, Johnson & Kindness

[57] ABSTRACT

Apparatus and methods for detecting NMR signals from small samples using mechanical oscillators. In one embodiment, the sample is affixed to the mechanical oscillator, and immersed in a magnetic field. Magnetic resonance is detected by monitoring the mechanical excitation of the oscillator. The greatest excitation occurs when there is a three-fold resonance between the spin precession frequency of the sample, the natural frequency of the oscillator, and the oscillation frequency of the applied time dependent magnetic field. Samples as small as a single atomic nucleus can generate a detectable signal. In a second embodiment, the sample is affixed to a mechanically vibrating substrate, and a magnetic source is affixed to the mechanical oscillator.

22 Claims, 4 Drawing Sheets 5,166,615

SYSTEM FOR DETECTING NUCLEAR MAGNETIC RESONANCE SIGNALS FROM SMALL SAMPLES

FIELD OF THE INVENTION

The present invention relates to apparatus and methods for detecting nuclear magnetic resonance in small samples by the use of mechanical oscillators. In one embodiment, the sample of interest is affixed to a mechanical oscillator, and the sample is immersed in a large-gradient magnetic field. Spin precession then exerts a cyclic force on the oscillator. The presence of magnetic resonance is detected by monitoring the mechanical excitation of the oscillator. The greatest excitation occurs when there is a three-fold resonance between the spin precession frequency, the resonant frequency of the oscillator, and the drive frequency of an applied time-dependent magnetic field. Samples as small as a single atomic nucleus can generate a detectable signal. In another embodiment, the sample of interest is affixed to a mechanically vibrating substrate, and a magnetic source is affixed to a mechanical oscillator. When the mechanical oscillator is brought near to, but not touching, the vibrating substrate, the oscillator will be mechanically excited, by virtue of the reciprocal force exerted between the atomic spins and the magnetic source. The presence of magnetic resonance is detected by monitoring the mechanical excitation of the oscillator. The greatest excitation occurs when there is a three-fold resonance between the spin precession frequency, the resonant frequency of the oscillator, and the vibration frequency of the substrate. Samples as small as a single atomic nuclear can generate a detectable signal.

BACKGROUND OF THE INVENTION

This application describes an invention for detecting nuclear magnetic resonance using a mechanical oscillator. Three apparatuses are described which embody the invention. The first apparatus is designed to detect magnetic resonance in samples whose mass is of order one microgram. The second and third apparatuses are designed to detect magnetic resonance in samples whose size is that of individual molecules or atoms.

The invention described herein can be used to determine the structure of biological molecules, and in fact was devised with this objective in mind.

As a historical precedent, systems and methods for inductive detection of nuclear magnetic resonance found widespread medical application in imaging the human body. Similarly, the systems and methods for oscillator-based detection of nuclear magnetic resonance described herein have applications in imaging the structure of individual molecules, although the applications of oscillator-based detection are not necessarily confined to this area.

In understanding the utility of this invention, it is useful to enquire whether the inductive methods presently used in medical imaging might be adapted for use in imaging individual atoms and molecules. A hypothetical atomic-scale inductive imaging apparatus might employ transmitting and receiving antennas of a few nanometers in length, so that the sensitive volume would be of the same size as a typical protein molecule. Such an apparatus would effectively be a scaled-down version of a conventional medical imaging apparatus. The hypothetical transmitting and receiving antennas would monitor spin flips in the molecule by inductively coupling the spins to a sensitive electronic amplifier, just as they do in conventional imaging apparatuses.

A major difficulty with inductive imaging of molecules is that it is not clear how nanometer-scale transmitter or receiver coils could be fabricated, nor whether they would generate electric signals of detectable power. While it cannot be definitely asserted that inductive detection of magnetic resonance in a single nucleus is impractical or impossible, no practical molecular imaging apparatus using inductive detection methods has yet been demonstrated.

Thus there is a substantial need for a method for detecting magnetic resonance is molecule-sized samples.

The information that a molecular imaging apparatus could provide would be of substantial medical interest. Amino acid sequences are known for thousands of biologically important molecules, but the scientific community does not known the shapes of these molecules or how they work, except for a few exceptional cases.

This makes the rational design of treatments for (e.g.) AIDS very difficult. Of the proteins encoded by the AIDS genome, only one, namely HIV protease, has a known three-dimensional structure [1]. The remaining proteins, in particular the HIV reverse transcriptase molecule which is essential for retroviral replication, have so far proven resistant to x-ray crystallography, which is (at present) the most widely-used technique for determining protein structures. The missing structural information is a significant obstacle to the rational design of drugs and vaccines for AIDS.

As another example, cystic fibrosis is an inherited disorder associated with a defective gene which codes for the protein known as cystic fibrosis transmembrane conductance regulator (CFTR). Approximately one person in thirty carries a defective gene for CFTR. If both spouses carry the gene, then one in four of their children will be at severe risk for early death from pulmonary insufficiency and/or infection. Like the overwhelming majority of transmembrane proteins, CFTR is resistant to crystallization, and thus its structure cannot be determined by x-ray crystallography. Another obstacle is that CFTR is a large molecule, containing 1480 amino acids, and is too complex for conventional magnetic resonance spectra to give much structural information.

For these reasons the shape of the CFTR molecule is not known, not is it certain wheat the function of the normal protein is, nor is it known what structural defects are created by the known mutations associated with cystic fibrosis. This lack of information is a significant barrier to the development of methods for treating cystic fibrosis. Many other examples could be cited in which lack of information regarding molecular structure is a substantial obstacle to developing effective medical treatments.

This application describes a method and a system for detecting magnetic resonance which does not make use of inductive loops, but instead used mechanical oscillators to detect magnetic resonance, and which thereby avoids the practical difficulties associated with inductive detection of magnetic resonance in small samples.

SUMMARY OF THE INVENTION

A system for transferring energy to a mechanical oscillator, the system comprising: a mechanical oscillator having a natural frequency of oscillation; a material containing nuclear spins, in proximity to the mechanical oscillator; means for applying a substantially time independent magnetic field to said material, such that said material has a spin precession frequency that is approximately resonant with the natural frequency of the mechanical oscillator; means for applying a time dependent magnetic field to said material, the time dependent magnetic field oscillating at a field frequency that is approximately resonant with said spin precession frequency; means for applying a magnetic field gradient to said material, such that mechanical energy is transferred to the mechanical oscillator, causing it to oscillator at its natural frequency; and means for detecting the oscillation of the mechanical oscillator.

DETAILED DESCRIPTION OF THE EMBODIMENTS

Three different apparatuses are presented, each of which embodies the claimed system and method for oscillator-based detection of magnetic resonance. Although the details of the described embodiments vary, it will be apparent that they have in common the following characteristics;

(1) A mechanical oscillator is present.

(2) A sample containing nuclear magnetic spins is present.

(3) A source of magnetic field is present.

(4) The nuclear spins in the sample experience a magnetic field which has a substantially time-indendent component, a time-dependent component, and a spatial gradient component.

(5) The precession of spins in the sample exerts a cyclic force on the mechanical oscillator, such that mechanical energy is transferred to the oscillator.

The presence of magnetic resonance in the sample is detected by monitoring the mechanical excitation of the oscillator. In a later section, it will be shown that the mechanical excitation is greatest when there is a three-fold resonance between the natural frequency of the mechanical oscillator, the precession frequency of the nuclear spins in the sample, and the frequency of the time-dependent magnetic field experienced by the spins in the sample.

Figure 1:
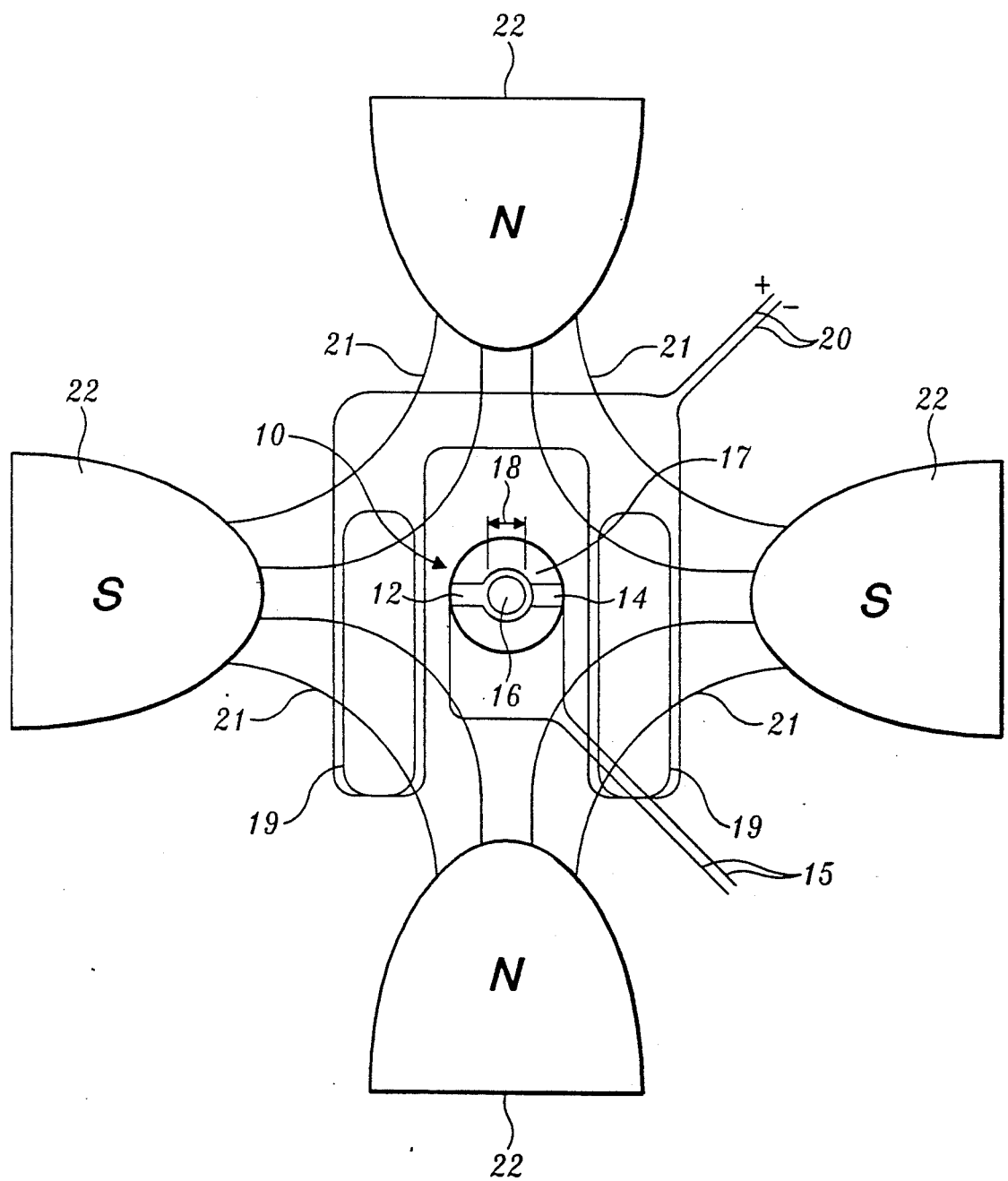
FIG. 1 is a schematic representation of an apparatus for macroscopic samples according to the present invention.

An apparatus suitable for microgram-scale samples is shown in FIG. 1. The heart of the apparatus is a mechanical oscillator, which in this particular design is a disc-shaped quartz crystal 17 [2]. A quartz oscillator is chosen because they are available in a wide range of frequencies, cost only a dollar or two, and have quality factors Q in the range $10^5$–$10^7$. FIG. 1 shows a typical commercial oscillator 10 after removal of its protective can. The oscillator has a top electrode 12, a bottom electrode 14 and two signal leads 15 connected thereto.

The sample 16 is plated onto the top electrode 12 of the crystal 17. In the embodiment shown, the sample 16 has a diameter 18 of approximately 1 mm. The crystal is then immersed in a magnetic field 16 that has (1) a uniform component, (2) a time-dependent component, and (3) a gradient component. In general the gradient component should be as strong as practical, to enhance the spin-oscillator coupling, yet in the embodiment of FIG. 1 it is also desirable that the field magnetic be approximately constant over the sample volume, in order to maintain spin coherence as long as possible. These two objectives lead to the quadrupole geometry shown in FIG. 1 generated by field generators 22; higher order refinements to this basic geometry will be discussed in a following section.

To generate a nuclear magnetic resonance signal, a $\pi/2$ pulse is applied to the drive coils 19 through the drive coil inputs 20, so that the spins in the sample begin to precess. The term "$\pi/2$ pulse" is conventional in magnetic resonance imaging terminology: it denotes an applied pulse so designed as to rotate the spin axis in the sample by 90 degrees, thus initiating spin precession in the sample. In the apparatus of FIG. 1, the frequency applied to the drive coils 19 during the $\pi/2$ pulse is approximately resonant with the spin precession frequency, and also approximately resonant with the natural frequency of the crystal oscillator 10, thus ensuring that a three-fold resonance is present during apparatus operation.

Because of the field gradient, the "flipped" spins exert a cyclic shear force on the crystal face. Disc-shaped crystal oscillators resonate in a shear mode, so that spin force couples efficiently to the oscillator. Because the precession frequency is resonant with the crystal frequency, the crystal becomes mechanically excited. This generates an output voltage, via the piezoelectric properties of the crystal.

Figure 2:
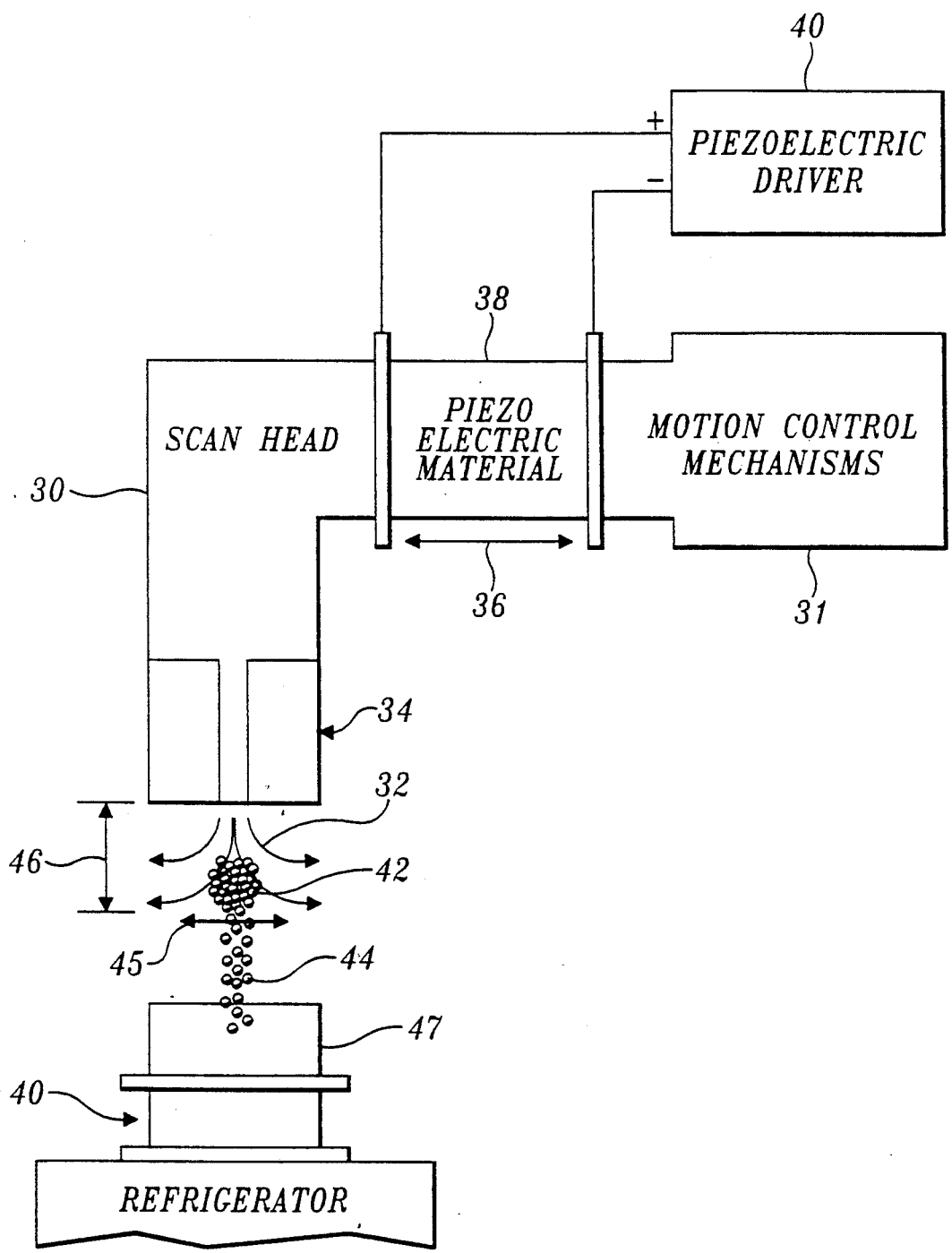
FIG. 2 is a schematic representation of an apparatus for single molecule studies according to the present invention.

FIG. 2 shows an apparatus optimized to detect spin precession of individual protons in a molecule. The apparatus is superficially different from that of FIG. 1, but is based on the same physical principles. It consists of a scanning head 30, similar to those used in scanning tunneling microscopes [3], whose position is controlled along all three axes with resolution of approximately 0.01 Å by a motion control mechanism 31 at in scanning microscopy. The scanning head differs from conventional designs in that it carries a bundle of magnetic flux 32 trapped in a superconductor 34, and it also differs in that it is capable of rapid oscillatory scan motions (0.01 to 1.0 Å amplitude at ~40–400 MHz) along the axis indicated by arrow 36, in addition to the usual slower positioning motions. The rapid oscillatory scan motion is produced by a piezoelectric material 38 excited by a piezoelectric driver 40 operating at the resonant frequency of an oscillator 44 as described below.

A key feature of the embodiment of FIG. 2 is that the flux bundle alone provides all three magnetic field components that are essential to oscillator-based detection: a substantially time-independent component, a time dependent component, and a gradient component. In contrast, the embodiment of FIG. 1 uses separated sources for the field components. In a later section, we will describe yet another system and method for generating the field components (see FIG. 3).

Underneath the scan heat is a molecule 42, nominally a protein whose structure is to be determined. In the embodiment shown, the molecule 42 is located approximately 100' from the scan head as indicated by arrow 46. It is mounted on a mechanical oscillator 44 that oscillates along the axis shown by arrow 45, which may be either a single molecule, or a structure fabricated by nanolithography. The important parameters of the oscillator 44 are its mass m, its resonant frequency $\omega$, and its quality factor Q; otherwise there is great freedom in oscillator design and fabrication. More will be said on the subject of oscillator design in a following section.

The oscillatory motions of the scan head 30 transfer energy into the oscillator 44, via the spin-oscillator-gradient coupling. The oscillator energy thermalizes, is transferred into a heat sink 47, and thereby generates a signal in the temperature sensor 40 at the bottom of the figure. Energy transfer is greatest when there is a three-fold resonance between the scan frequency, the natural frequency of the oscillator, and the precession frequency of an individual proton in the molecule.

By moving the scan head 30 in three dimensions, and monitoring the energy transfer as individual protons move in and out of resonance with the applied field, information about the three-dimensional structure of the molecule can be acquired. Other methods for modulating the oscillator signal, and thus obtaining information about the spatial distribution of spins in the sample, will be described in a later section.

Figure 3:
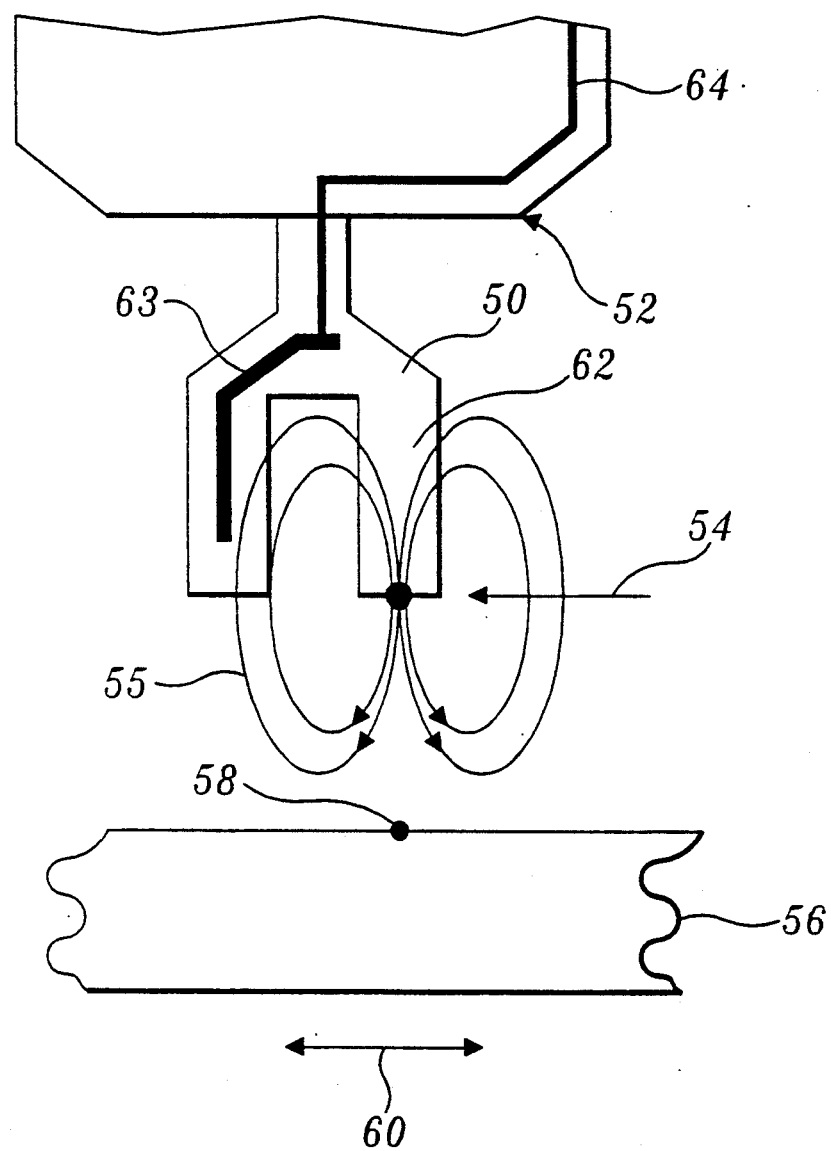
FIG. 3 is a schematic representation of an apparatus for detecting nuclear magnetic resonance of a single proton by nonconductive means.

We will refer to apparatuses similar to FIG. 1 as "macroscale apparatuses", and apparatuses like those of FIGS. 2 and 3 as "microscale apparatuses".

There is an important difference between a macroscale apparatus and a microscale apparatus. In a macroscale apparatus, the initial $\pi/2$ pulse creates potential energy, which is stored in the orientation of the spins. One characteristic of a macroscale apparatus is that the potential energy of the spins is much greater than the mechanical energy that appears in the oscillator. The practical consequence is that, after the initial $\pi/2$ pulse, no further excitation of the drive coils is required to obtain an output signal.

Microscale apparatuses behave differently, in that each nucleus absorbs and emits multiple quanta. A continuously applied time-dependent field is needed to supply these quanta. So in a microscale apparatus, the time-dependent component of the magnetic field experienced by the spins is maintained while the oscillator energy builds up.

If only a single nucleus is being excited in a microscale apparatus, then no initial $\pi/2$ pulse is required, as can be shown by solving the quantum equations of motion. The quantum equations are discussed in greater detail in a following section. It turns out that variations in the initial spin state affect the phase of the excited oscillator, but not the mechanical energy. A heuristic way to understand this is to reflect that a $\pi/2$ pulses serves to bring a large number of spins into a single coherent state. When there is only one spin, there can be no incoherence, hence no need for a $\pi/2$ pulse. There is also no need to maintain a uniform field magnitude. Techniques used when a molecule contains multiple spins will be discussed in a following section.

The field gradient of the microscale apparatus in FIG. 2 is $\sim 10^7$ times stronger than that of the macroscale apparatus in FIG. 1. Consequently, the nuclei in the microscale apparatus experience a constantly changing local magnetic environment, as a consequence of oscillator motion in the gradient. This changing local field plays an important role in enhancing the quantum efficiency in microscale apparatuses.

BASIC PHYSICS OF MACROSCALE AND MICROSCALE APPARATUSES

Here we summarizes some results describing the physics of macroscale and microscale apparatuses. Classical and quantum derivations of these results are presented in a following section. Also, the results of this section apply to single-nucleus samples; in following sections they are generalized to include samples with many nuclei.

By design, the externally applied magnetic field $\vec{B}(\vec{x},t)$ is has a uniform component, a time-dependent component, and a gradient component;

$$\vec{B}(\vec{x},t) = \vec{B}_c + \vec{B}_t \cos(\omega t) + Gx, \quad (1)$$

with $\vec{B}_c$, $\vec{B}_t$, and G approximately constant. Because $\vec{B}$ is divergence-free and curl-free, the gradient matrix G is necessarily symmetric with zero trace.

In physical terms, $\vec{B}_c$ tunes the resonance, $\vec{B}_t$ provides motive power, and G couples the spin to the oscillator motion. Device physics are conveniently described in terms of the dimensionless constants $\delta$, $\epsilon$, and $\beta$, defined by:

$$\delta = |\vec{B}_c|/B_0 - 1 \quad (2)$$

$$\epsilon = \tfrac{1}{2}|(I - \hat{z} \otimes \hat{z}) \cdot \vec{B}_t|/B_0 \quad (3)$$

$$\beta = [\hbar \omega/(m \omega^2 L^2)]^{\frac{1}{2}} \quad (4)$$

with $B_0$ the field strength needed to flip spins at the resonant frequency $\omega$, $\hat{z} = \vec{B}_c/|\vec{B}_c|$ the direction of the field, $\hat{n}$ the axis of oscillator motion, and $L = B_0/|(I - \hat{z} \otimes \hat{z}) \cdot G \cdot \hat{n}|$ a length scale characteristic of the gradient.

At equilibrium, there is a continuous power flow $W = \langle n \rangle \hbar \omega^2/Q$ into the oscillator, balanced by energy losses due to oscillator damping. The mean quantum occupation number $\langle n \rangle$ at equilibrium is found to be:

$$\beta^2 \langle n \rangle = \epsilon^2 + \epsilon_{crit}^2 + \epsilon^2 - [(\epsilon^2 + \epsilon_{crit}^2 + \epsilon^2)^2 - 4\epsilon^2 \epsilon_{crit}^2]^{\frac{1}{2}} \quad (5)$$

with $\epsilon_{crit} \equiv \beta^2 Q/4$. For $\epsilon \geq \epsilon_{crit}$ and $\delta = 0$ (resonant tuning), we find $\langle n \rangle = \beta^2 Q^2/8$. For $\epsilon < \epsilon_{crit}$ we find $\langle n \rangle = 2\epsilon^2/\beta^2$.

From an engineering point of view, there is little practical advantage in applying time-dependent magnetic fields with strength $\epsilon > \epsilon_{crit}$, because the oscillator energy is not thereby increased. On the other hand, for $\epsilon < \epsilon_{crit}$ the system has reduced energy at equilibrium, and (as can be shown) undergoes oscillations before settling to equilibrium. Thus $\epsilon = \epsilon_{crit}$ is a natural setting.

At $\epsilon = \epsilon_{crit}$ the spin functions as a highly efficient electromechanical transducer. To see why this is so, note that the time-dependent field exerts a torque $T_{mech}$ on the particle. $T_{mech}$ is maximal when the spin direction $\langle \vec{\sigma} \rangle$ is at right angles to the time-dependent field, in which case $T_{mech} = \epsilon \hbar \omega/2$. The physical limit to power transfer is therefore $W_{max} = \omega T_{mech} = \epsilon \hbar \omega^2/2$. For $\epsilon = \epsilon_{crit}$ we recover the previous result $W_{max} = \beta^2 Q \hbar \omega^2/8$, which saturates the physical limit.

Numerical integration of the classical equations of motion shows the $\tau = Q/\omega$ is a reasonable estimate of the time $\tau$ for the damped system to reach equilibrium.

Spin-mediated electromechanical transduction has unusual scaling behavior at small spatial dimensions: signal power increases as the apparatus is made smaller. More precisely, as the extrinsic apparatus parameters m and L are made smaller, with the intrinsic parameters Q and $\omega$ held constant, power transfer into the oscillator scales as $m^{-1}L^{-2}$.

If the overall size of an apparatus is represented by a length scale $\lambda$, then the oscillator mass m will scale as $\lambda^{-3}$, and the gradient scale L will scale as $\lambda^{-1}$. We will suppose that the frequency $\omega$ and the quality factor Q of the oscillator are held constant while the overall length scale $\lambda$ is changed. Then the mechanical excitation induced by a single nucleon will scale as $\lambda^{-5}$. Therefore, this simple scaling argument indicates that if the overall spatial size of an apparatus is reduced by a factor of ten, the oscillator excitation increases by a factor of 100,000. This is one reason why oscillator-based detection is especially advantageous for small sample sizes.

DESIGN CONSIDERATIONS FOR THE MACROSCALE APPARATUS OF FIG. 1

In the apparatus of FIG. 1, the sample 16 is taken to consist of frozen water, plated onto the crystal 17 in a layer of thickness h and diameter d. The apparatus is operated at a temperature T. After a $\pi/2$ pulse is applied, the number of precessing spins is $$n_{spin} = \frac{\pi}{4} h d^2 \rho_{spin} \tanh\left(\frac{\hbar \omega}{kT}\right) \quad (6)$$

with $\rho_{spin}$ the spatial density of spins in the sample. Low temperatures are advantageous, because the number of precessing spins is thereby increased. The oscillator equilibrium time $\tau = Q/\omega$ is required to be of the same order or shorter than the spin decorrelation times $T_1$ and $T_2$, so that the spins evolve coherently during a measurement.

The equilibrium mechanical energy $E_{mech}$ generated by a macroscopic sample is $E_{mech} = n_{spin}^2 \beta^2 Q^2 \hbar \omega / 8$, larger by a factor $n_{spin}^2$ than the single-nucleon case previously discussed.

The strength of the magnetic field determines the precession frequency $\omega$, which in turn determines the crystal thickness $\theta = \pi v/\omega$, with $v$ the speed of sound in the crystal. For a Y-cut quartz plate, $v = 3908$ m/sec [2]. The effective mass m of the oscillator is $$m = \frac{1}{2} \rho_{quartz} \frac{\pi}{4} e d^2 \quad (7)$$

with $\rho_{quartz} = 2.6$ g/cm$^3$. The leading factor of $\frac{1}{2}$ arises because the midplane of the disc is a node, so that motion occurs predominantly at the crystal faces. This reduces the motional mass of the oscillator to one-half the physical mass.

For quartz crystals, the electrostatic energy is typically ~1% of the mechanical energy [2]. The signal voltage V therefore satisfies $$\tfrac{1}{2}CV^2 = r^2 E_{mech} = r^2 n_{spin}^2 \beta^2 Q^2 \hbar \omega / 8, \quad (8)$$

with the electromechanical coupling $r^2 \approx 0.01$, depending on details of crystal design. The capacitance C is $$C = 4.5 \epsilon_0 \frac{\pi}{4} \frac{d^2}{e}. \quad (9)$$

Bottom's test [2] gives a more elaborate analysis that takes into account the orientation of the crystal faces with respect to the crystalographic axes, and the nonuniform space charge distribution within the crystal. This yields essentially the same voltage.

As previously mentioned, it is desirable that the field gradient be as strong as possible, and yet the field magnitude must be uniform to within $1 \pm Q^{-1}$, so that the spins maintain their coherence long enough to generate a signal. A magnetic potential $\phi$ with the required properties is $$\phi = B_0[z + (x^2 - y^2)/2L + (\tfrac{2}{3}z^3 - zx^2 - zy^2)/2L^2]. \quad (10)$$

where x and y are cartesian coordinates in the plane of the crystal disc, and z is the coordinate normal to the disc.

The three terms in $\phi$ separately satisfy $\nabla^2 \phi = 0$, so the net field is as the sum of uniform component, a quadrupole component, and a correction field. The latter could be generated by Helmholtz-style trim coils. For a sample of diameter d, the resulting field magnitude is uniform to within $1 \pm d^4/256L^4$ over the sample volume. For the apparatuses described in Table 1, the field magnitude is uniform to one part in $2.5 \cdot 10^6$.

Table 1 summarizes the performance of four different macroscale apparatuses. All the apparatuses operate at 1 Tesla, using a water sample of 780 ng in a layer 10 $\mu$ thick and 1 mm in diameter. The crystal thickness is 46 $\mu$, and the quality factor Q is $10^5$, at the low end of the achievable range. The damping time of the oscillator is 370 $\mu$sec, which sets the time scale during which power flows into the oscillator.

The apparatuses vary in the temperature at which they operate, and in the strength of the field gradient. Design #1 is an high-performance (and expensive) design, operating at 30 mK, while a 10 millimeter gradient. The output signal is correspondingly strong, at 5220 $\mu$V. Design #1 would generate microvolt signals from a nanogram water sample.

Design #2 raises the temperature by a factor of 100 to 3 K, and the output voltage is correspondingly reduced by an equal factor of 100, to 52 $\mu$V. Design #3 increases the gradient scale by a factor of ten, and the signal drops by an equal factor of ten, to 5.2 $\mu$V.

In Design #4, which operates at liquid nitrogen temperatures, the oscillator energy is only 8% of the thermal energy (the second row from bottom of Table 1), so the 1.7 $\mu$V output signal would be masked by thermally excited oscillator motion. This shows that operation a liquid helioum temperatures is advantageous.

These calculations indicate that it is quite practical to detect nuclear magnetic resonance in a macroscopic sample by spin-mediated electromechanical transduction.

Spin-mediated electromechanical transduction is quite different from the nuclear-quadrupole induction of atomic polarization described by Sleater et al. [4]. In their apparatus the output voltage was generated by quadrupole-induced atomic polarization, and not by electromechanical transduction; the sample was not immersed in a strong gradient field; and mechanical oscillations did not generate the signal.

DESIGN CONSIDERATIONS FOR THE MICROSCALE APPARATUS OF FIG. 2

The macroscale apparatuses of FIG. 1 and Table 1 needed $\sim 10^{14}$ precessing spins to get a signal. So how can we obtain a detectable signal from a single nucleon? The scaling relation $E_{mech} \propto n_{spin}^2 m^{-1} L^{-2}$ suggests that reducing L by a factor of $10^{-7}$, and m by a factor of $10^{-14}$, would allow single nucleon detection with no loss if signal. The point of this simple scaling calculation is that there is nothing in the basic physics to prevent single nucleon detection.

Table 2 summarizes the performance of four different single-nucleus designs, illustrating the trade-offs between the various parameters. The designs assume that resonance is detected by bolometric means, specifically measuring the thermal power dissipated in the oscillator. Alternative means of detecting oscillator excitation will be discussed in a following section.

What is the spatial resolution of these designs? At $\delta = \epsilon = \epsilon_{crit}$, W is $(3-\sqrt{5})/2 \approx 38\%$ of $W_{max}$. Assuming that the detuning of $\delta$ reflects motion of the magnetic probe during the scanning process, the spatial resolution $L_{res}$ associated with a 62% decrease in thermal power is $$L_{res} = \beta^2 QL/4. \qquad (11)$$

$L_{res}$ is less than an Angstrom for all the designs (Table 2).

The resolution of these designs is essentially one-dimensional. For typical apparatus parameters (e.g. Design #5), all the spins in a hemispherical surface of radius $\sim 100$ Å and thickness $\sim 0.59$ Å will satisfy the three-fold resonance condition, and thus contribute to the thermal signal. In a following section on we will discuss techniques for achieving more detailed spatial resolution.

Design #5 achieves the largest thermal signal, $\sim 8000 \hbar \omega/$msec, because it employs the strongest fields and gradients, and has the smallest mass oscillator. In comparison, Designs #6, #7, and #8 each have a diminished signal strength of $\sim 80 \hbar \omega/$msec. Design #6 has a diminished signal because a large-mass oscillator is employed. However, Design #6 enjoys a compensatory improvement in spatial resolution to the $\sim 0.01$ Å level. In Design #7 the signal is diminished for a different reason: the applied fields and gradients are weak. Design #8 uses the same weak fields as #3, but the mass and the quality factor of the oscillator are increased by 100. This leaves the signal and the spatial resolution unaffected, but increases the response time of the oscillator.

One method for generating the required strong field gradients is to used trapped magnetic flux quanta. Matsuda et al. [5] have imaged trapped magnetic flux quanta using electron-holographic interferometry. The images show that the magnetic field in the half-space external to the superconductor resembles that of a magnetic monopole centered at the vortex core. Hess et al. [6] have used a scanning tunneling microscope to image superconducting vortices in NbSe$_2$, and find core radii that are on the order of 100 Å.

The imaging parameters associated with trapped flux quanta are readily calculated. Let $N_\Phi$ be the integrated number of flux quanta trapped in the vortex. Let $\vec{r}$ be the vector from the vortex core to the molecular oscillator. Then the $\vec{B}$ field external to the core, at distances comparable to or greater than the core radius, is $$\vec{B} = N_\Phi \frac{\Phi_0 \vec{r}}{2\pi |\vec{r}|^3}, \qquad (12)$$

where $\Phi_0 = \pi \hbar /e$ is the flux quantum. For the geometry of FIG. 1, the resulting apparatus parameters are $L = |\vec{r}|$ and $B_c = 6.6 \, N_\Phi (100 \, \text{Å}/|\vec{r}|)^2$ (result in Tesla).

The apparatus of FIG. 2 generates the required time-dependent field by mechanically oscillating the scanning head 30 at the resonant frequency $\omega$. This method ensures that all fields applied to the system have microscopic length scales, which minimizes eddy current generation of parasitic heat. If the scan head oscillation amplitude is $\vec{a}$, and $\vec{a} \cdot \vec{r} = 0$ (as shown in FIG. 2), and the resonant mode of the oscillator is collinear is with the scan head oscillation (as in the flexural mode shown in FIG. 1), then the appropriate magnitude for $\vec{a}$ is $$|\vec{a}| = \epsilon L. \qquad (13)$$

Because suitable values of $\epsilon$ are typically $\sim 10^{-3}$, the required $|\vec{a}|$ is a fraction of an Angstrom.

DESIGN CONSIDERATIONS FOR THE MICROSCALE APPARATUS IN FIG. 3

FIG. 3 shows an alternative embodiment for detecting nuclear magnetic resonance by noninductive means. A mechanical oscillator 50 is mounted on a scanning head 52 controlled by a motion control apparatus of the type used in tunneling microscopy. Attached to the oscillator is a magnetic field source 54 that produces magnetic field as represented by flux lines 55. The oscillator 50 is brought near an oscillating substrate 56, which has a proton 58 on its surface (i.e., a hydrogen atom). The substrate oscillates along an axis as shown by arrow 60 between approximately 0.01 to 1.0'. The proton 58 exerts a force on the mechanical oscillator 50, by virtue of its magnetic moment interacting with the field gradient. Provided the substrate motion is resonant with the oscillator, there will be energy transfer between the substrate 56 and the oscillator 50. This energy produces an output voltage in a piezoelectrode 63 which is connected to external equipment (not shown) by a signal lead 64.

The substrate 56 is assumed to contain few or no nuclei which are magnetically resonant (e.g., containing substantially spin zero isotopes, or alternatively containing nuclei whose magnetic moments do not match those in the sample of interest). Also, in a following section we discuss the case in which the particle is a nucleus other than a proton, or in which there are multiple nuclei contained in a molecule or molecules affixed to the substrate.

We will be especially interested in the case of a three-fold resonance between the oscillator frequency, the substrate frequency, and the precession frequency of the proton. We will find that when a three-fold resonance occurs, the energy transfer is sufficiently enhanced that single nucleon detection is possible by monitoring the mechanical excitation of the oscillator.

The proton experiences a magnetic field $\vec{B}(\vec{a}(t) - \vec{x}(t))$, with $\vec{a}(t)$ the position of the substrate, and $\vec{x}(t)$ the position of the oscillator. Substrate motion can be parameterized as $\vec{a}(t) = \vec{a}_0 + A \cos(\omega t) m$, with A the substrate amplitude and m the axis of motion. Similarly, oscillator motion is parameterized as $\vec{x}(t) = \vec{x}_0 + X(t) n$, with X(t) the oscillator amplitude, and n the axis.

Expanding about $\vec{a}_0$ and $\vec{x}_0$, the magnetic field $\vec{B}$ seen by the nucleus is $$B = B_c + A\, G\cdot\hat{m}\, \cos(\omega t) - X(t) G\cdot\hat{n} \quad (14)$$

Because $\vec{B}$ is divergence-free and curl-free, the gradient matrix G is necessarily symmetric with zero trace.

In a quantum mechanical analysis, X(t) is replaced by a quantum operator $X_{op}$. As described in a later section, the resulting Hamiltonian is equivalent to that of a system consisting of: (1) a harmonic oscillator, (2) a nucleus mounted on the oscillator, and (3) an externally applied magnetic field.

It is important to note that, in the embodiment of FIG. 3, the nucleus is not mounted on the oscillator (as it was in FIG. 2), but instead is affixed to a moving substrate. Thus the time-dependent field experienced by the particle is generated by substrate motion in a field gradient, and not by an external time-dependent field source. However, the Hamiltonian is essentially the same as described in the preceding paragraph, and therefore so is the physics, by virtue of the reciprocal force existing between the proton and the field source.

The dynamical behavior of the spin-oscillator system is conveniently expressed as before in terms of dimensionless parameters $\delta$, $\epsilon$, and $\beta$. For the embodiment of FIG. 3, these are given by:

$$\delta = |\vec{B}_c|/B_0 - 1, \quad (15)$$

$$\epsilon = \tfrac{1}{2} A |(I - 2\hat{z}\otimes\hat{z})\cdot G\cdot\hat{m}|/B_0, \quad (16)$$

$$\beta = [\hbar\omega/(m\omega^2 L^2)]^{\tfrac{1}{2}}, \quad (17)$$

with $B_0$ the field strength needed to flip spins at the resonant frequency $\omega$, $\hat{z} = \vec{B}_c/|\vec{B}_c|$ the direction of the field, and $L = B_0/|(I - \hat{z}\oplus\hat{z})\cdot G\cdot\hat{n}|$ a length scale characteristic of the gradient. If the oscillator motion and the substrate motion are collinear (as in FIG. 3), then A and $\epsilon$ are related by $A = 2\epsilon L$.

The similarity between the apparatus of FIG. 2 and the apparatus of FIG. 3 is apparent in that the device physics of both apparatuses can be summarized in terms of the same set of dimensionless Hamiltonian parameters $\delta$, $\epsilon$, and $\beta$.

At equilibrium, the oscillator is excited to an energy $E = \hbar\omega\langle n\rangle$, with the quantum number $\langle n\rangle$ given by $$\beta^2 \langle n\rangle = \epsilon^2 + \epsilon_{crit}^2 + \delta^2 - [(\epsilon^2 + \epsilon_{crit}^2 + \delta^2)^2 - 4\epsilon^2 \epsilon_{crit}^2]^{\tfrac{1}{2}}, \quad (18)$$

Here $\epsilon_{crit} \equiv \beta^2 Q/4$. For $\epsilon \geq \epsilon_{crit}$ and $\delta = 0$, i.e., three-fold resonance tuning, we find $\langle n\rangle = \beta^2 Q^2/8$, so that the oscillator excitation becomes independent of $\epsilon$. For this reason there is no practical advantage in applying substrate motions with $A > \beta^2 QL/2$, because the oscillator energy is not thereby increased.

What is the spatial resolution? At $\delta = \epsilon = \epsilon_{crit}$, $\langle n\rangle$ is reduced to $(3 - \sqrt{5})/2 \approx 38\%$ of its maximal value. Assuming that the detuning of $\delta$ reflects motion of the probe during the scanning process, the spatial resolution is $\sim \epsilon L$, i.e., of the same order as the substrate motion.

Now we have all the results needed for apparatus design. We first choose a magnetic source (lines 1 and 2 of Table 3) that combines strong fields and large gradients. Design #9 uses a spherical permanent magnet 20 Å in diameter, with magnetization $\mu_0 M = 1$ Tesla. The permanent magnet generates the entire field, as Design #9 uses no other field source. In contrast, Designs #10, #11, and #12 use permeable spheres 20 Å in diameter, with saturation magnetization $\mu_0 M = 2$ Tesla (typical of iron). These spheres are immersed in externally applied fields of 2 Tesla, 10 Tesla, and 10 Tesla respectively. At the surface of the spheres the field magnitude $B_c$ and gradient scale L can be readily shown [7] to be as given in lines 1 and 2 of Table 3. Still larger field gradients could be obtained by employing sharp-tipped, instead of spherical, field sources.

We next specify the oscillator parameters (lines 3 and 4 of Table 3). Oscillator masses m range from $10^6$ to $10^{11}$ amu. Oscillator quality factors Q range from $3 \times 10^5$ to $10^7$, similar to typical radio frequency quartz oscillators [2].

The resonant frequency of the mechanical oscillator is, by design, set equal to $\gamma B_c$, with $\gamma$ the gyromagnetic ratio of the proton (line 5 of Table 3). This ensures that the oscillator frequency matches the spin precession frequency. If we adopt a clamped beam design for the oscillator (regarding a tuning fork as a pair of clamped beams), then the mass and the frequency taken together determine the length and thickness of the oscillator prongs (lines 6 and 7 of Table 3). The dimensions shown are for quartz prongs, not because quartz is necessarily the best material for the job, but because it is well understood. We have taken into account that the motional mass of a clamped beam is $\tfrac{1}{4}$ the total mass [8].

It is now a simple exercise to determine the oscillator excitation. The gradient coupling $\beta$ (line 8 of Table 3) and the substrate amplitude A (line 9 of Table 3) are computed as previously described. The oscillator quantum number $\langle n\rangle$ and the mechanical energy E immediately follow (lines 10 and 11). The time for the oscillator to reach equilibrium is $\sim Q/\omega$ (line 13 of Table 3).

At this point it is convenient to review how the apparatus of FIG. 3 and Table 3 can be used. We suppose that the resonant frequency of the oscillator is known, and that the substrate has been set into motion at this same frequency, with amplitude A as given in line 9 of Table 3. A convenient and inexpensive substrate would be a "Y-cut" piezoelectric quartz plate, which are widely used in RF oscillators.

Hydrogen atoms are then deposited on the quartz substrate. To determine the spatial location of the hydrogen atoms, then the scan head is lowered to within a few Å of the surface, and spatially scanned. Protons couple resonantly to the scan head whenever the local spin precession frequency matches the oscillator frequency $\omega$ to within a factor $13 \equiv \epsilon$. For the designs of Table 3, the associated spatial resolution is a fraction of an Å (line 9 of Table 3). Once the head has reached a resonant position, it requires a time $\tau = Q/\omega$ to reach mechanical equilibrium (line 13 of Table 3). Quantum calculations show that no initial $\pi/2$ pulse i needed; any initial single-proton spin state will transfer energy into the oscillator. This is not necessarily true of multiple-nucleon samples, nor of single nucleons of spin higher than one-half. This point will be discussed in a following section.

By approaching a given nucleus from several different directions, and noting the position of the scan head at times when the oscillator becomes excited, the three-dimensional position of the nucleus can be determined. It is clear that when the nuclei of interest are densely distributed, multiple nuclei may contribute to the signal at any given scan head position. In such cases more sophisticated means of image reconstruction are required, as discussed in a later section.

At liquid helium temperatures the mechanical excitation is well above the Brownian noise kT (line 12 of Table 3). The quantum excitation $<n>$ (line 10) is enormously greater than the quantum limit on detection $<n> = \frac{1}{2}$ [9,10].

MONITORING OSCILLATOR EXCITATION

Many methods can be used to monitor oscillator excitation. As discussed in what follows, methods known in the prior art include, but are not necessarily limited to, thermistor means, piezoelectric means, electron tunneling means, optical means, capacitative means, and inductive means. Any of these means can be used in the claimed oscillator-based system and method for detecting nuclear magnetic resonance in small samples.

The apparatus in FIG. 2 uses thermistor means to detect oscillator motion. Thermistor devices are usually biased between two opposing limits: the bias power should be less than the input heat flux, and yet the bias voltage should be greater than the thermistor Johnson noise in the bandwidth of interest. Taking the signal bandwidth to be $\omega/Q$, it is readily shown that a thermistor-based molecular imager can satisfy these opposing constraints only if $$<n> > 32 \frac{kT}{\hbar \omega Q}, \quad (19)$$

with $<n>> = 2\epsilon^2/\beta^2$ the occupation number of the oscillator. This constraint is independent of the properties of the thermistor. All four designs of Table 1 satisfy this constraint.

High-resolution calorimetry is an active area of research [12,13,14]. Wang et al. [14] have reported experimental energy resolutions of 6 eV at 25 mK for a semiconductor thermistor having millisecond-scale time constants. The thermistor of Wang et al. measures 1 mm×1 mm×0.25 mm, which for our purposes is too large. To evaluate its potential use in a molecular imager, we reduce its physical dimensions by $10^{-3}$, leaving its intrinsic properties unchanged. This changes its area from 1 mm$^2$ to 1 $\mu^2$, its bias power from $\sim 10^{-13}$ Watts to $\sim 10^{-22}$ Watts, its static resistance from $\sim 4\cdot 10^7 \Omega$ to $\sim 4\cdot 10^{10}\Omega$, its bias voltage from $\sim 2$ mV to $\sim 2$ $\mu$V, its heat capacity from $10^{-11}$ J/°K to $10^{-20}$ J/°K, and its sensitivity from 0.3 V/°K to 0.3 mV/°K. For a thermal time constant of one millisecond, and an signal flux W$_{max}$, the output voltage V$_{signal}$ from the scaled thermistor is $$V_{signal} \approx 3\cdot 19^{13} \text{ (Volts/Watt) } W_{max}. \quad (20)$$

Referring to Table 2 for W$_{max}$, we find that V$_{signal}$ ranges from 66 $\mu$V for Design #5 to 0.06 $\mu$V for Design #8. These values compare to the Johnson noise associated with the thermistor, V$_{noise} \approx 6.6$ $\mu$V (rms) in a $10^3$ Hz bandwidth. So Wang's thermistor (scaled down) would be suitable for Design #5, but would not be sensitive enough for Devices #6 through #8, except through the use of averaging times longer than a millisecond.

The thermistor of Wang et al. is discussed solely as an example of what can be achieved using existing technology. Its performance can be improved by operating at lower temperatures. The fundamental limits to thermistor resolution are set by thermal fluctuations in the heat sink [12,13], and are not approached by the above thermistor.

The primary disadvantage of thermal detection methods is that they are not sensitive to the phase of the oscillator. Phase-sensitive detection, as occurs in conventional magnetic resonance imaging, would be preferable. We will outline several methods for phase-sensitive detection.

One method is to use a piezoelectric oscillator, just as in the macroscale apparatuses of FIG. 1. For definiteness, we will characterize a quartz oscillator suitable for Design #5 of Table 2. A quartz clamped beam 62 (FIG. 3) (i.e., a tuning fork) with prongs $\sim 102$ nm long and $\sim 5$ nm on a side will resonate at the requisite 428 MHz, and have a motional mass of $10^6$ amu. The capacitance associated with these dimensions is $\sim 4\cdot 10^{-18}$ Farads. Assuming an electromechanical coupling of K$^2$=0.01 as before, the voltage on the capacitor would be $\sim 640$ $\mu$V, and the associated charge would be $\sim 0.016$ $\theta$ ($\theta$=electron charge).

For the embodiment of FIG. 3, piezoelectric detection of quartz oscillator motion is summarized in lines 14–16 of Table 3. The capacitance of an oscillator prong of square cross-section is given in line 14, with the dielectric constant of quartz equal to 4.5 $\epsilon_0$. Assuming an electromechanical coupling r$^2$=0.01 (typical of quartz oscillators, as previously noted), the voltage and charge on the capacitor is as given in lines 15 and 16.

The induced voltages are substantial, on the order of hundreds of microvolts. The oscillators capacitance is of the same order or smaller than the input capacitance of a micron-scale field-effect transistor. It would therefore be desirable, but not necessarily essential, to construct the mechanical oscillator as part of an integrated amplifier circuit, thus minimizing lead length and other sources of parasitic capacitance. Alternatively, Likharev [8] has reviewed the physics of SET devices (SET=single electron transfer), which in principle have the necessary sensitivity.

Bocko [9] and Yurke and Kichanski [10] discuss the use of a scanning tunneling microscope as a high-gain, low noise displacement sensor. They show that, when used to monitor a harmonic oscillator, the noise energy added by the tunneling probe is $\hbar \omega/2$. This sensitivity is much better than that needed for the designs of Tables 2 and 3.

Many other methods for detecting oscillator motion exist in the prior art. The desired goal of phase-sensitive low-noise detection of oscillator motion is of a phonograph needle. As noted in the literature [15]:

"Phonograph designers have explored nearly all the known principles of electric generation, including the piezoelectric effect from certain crystals, variable resistance, variable capacity, variable magnetic flux cutting, variable magnetic reluctance, and variable light beam photoelectric efects. In general, it is possible to design a pick-up using any principle that will produce an electrical signal from a mechanical signal. The selection of the principle and the design of a pick-up is usually determined by cost, environmental conditions, etc. . . . Mechano-electromagnetic principles have found considerable use, moving-iron and moving-coil devices being commonest. Mechano-electrocapacity devices have also been employed."

The use of moving-iron mechano-electromagnetic principles is particularly advantageous for moving-substrate embodiments resembling those of FIG. 3, because in such embodiments the oscillator already contains a moving magnetic element, so that an inductive coil placed nearby can be used to detect oscillator motion by the same mechano-electromagnetic principle used in phonograph cartridges.

In addition to optical means used in phonography as mentioned above, optical means have been used to monitor displacement in atomic force microscopes, and in gravity wave detectors. In various embodiments, mechanical displacements are detected either interferometrically (as in a Michelson interferometer), or by angular displacements of a reflected light beam. Similar optical means can be used to monitor oscillator motion in the present apparatuses.

OSCILLATOR DESIGN

There is considerable freedom in oscillator materials and designs, provided that suitable values for M, $\omega$, and Q are obtained. Details of oscillator design are otherwise not constrained. In particular, the tuning fork geometry of FIG. 3 is not mandatory, but merely an example of an approach to high Q mechanical oscillator design that has been successfully used in radio frequency crystal oscillators.

Mechanical oscillators with mass $\sim 10^6$ amu to $\sim 10^8$ a.m.u. are comparable in masses of biological molecules. One approach, therefore, is to search the biological armamentarium for suitable candidates.

Perhaps it is best to turn the problem around, and regard oscillator-based detectors of nuclear magnetic resonance as tools for learning about the physics of small oscillators. Constructing and measuring the response of such oscillators to nuclear magnetic resonance would be a useful meeting ground for researchers and engineers interested in quantum chemistry, nanoscale fabrication techniques, and the quantum theory of measurement.

The prior art involving electronic circuits coupled to oscillators recognizes that the quality factor of the oscillator is affected by the loading of the electronic circuit, and that with an appropriate feedback element in the electronic circuit the quality factor of the oscillator may be increased. If the natural quality factor of an oscillator is less than that deemed optimal in a given apparatus, it may under these conditions be desirable to electronically enhance the magnitude of Q.

IMAGING TECHNIQUES

As previously mentioned, the apparatuses shown in FIG. 2 and FIG. 3 have sub-Angstrom spatial resolution, but only in one dimension. Roughly speaking, the raw spatial resolution is excellent in the radial direction, but nonexistent in the azimuthal directions. So a major challenge in operating a molecular imaging apparatus is to obtain three-dimensional resolution from an essentially one-dimensional signal.

Many other imaging devices share this problem, and it is generally solved by a deconvolution operation of one type or another. In x-ray computed tomography each x-ray beam gives a one-dimensional projection of the density, and the three-dimensional density is reconstructed using Random transformations. In magnetic resonance imaging the whole sample contributes to the signal, and spatial information is obtained by Fourier transforms. The problem occurs even in optical microscopy, where it is addressed using confocal scanning techniques.

The oscillator signal can be modulated in many ways. By slow motions of the scan head (i.e. with the time scales $t >> Q/\omega$) the signal from many different hemispheres can be measured. By intermediate-speed motions (i.e. times scales $Q/\omega >> t >> \omega^{-1}$) signals can be "dithered," so that the thermal output comes predominantly from that portion of the sensitive hemisphere which is tangent to the dithering motion. By high-speed nonadiabatic motions of the head in the apparatus of FIG. 2, (i.e. time scales $t << \omega^{-1}$) spin-flip transistions can be generated. Equivalently, in the apparatus of FIG. 3, by high-speed nonadiabatic motions of the substrate (i.e. time scales $t << \omega^{-1}$) spin-flip transitions can be generated. By adding a constant external $\vec{B}$ field, the hemispherical resonant surface can be distorted in various ways. All of these modulations give information about the spatial distributions of spins.

It will be appreciated that in modulations which involve a change in the spatial relation between the oscillator, the sample, and the magnetic source, the relative motions are of primary importance, while it is largely a matter of convenience which particular object (i.e., substrate as opposed to scanning head) is chosen to move in relation to the fixed laboratory frame of reference.

Spin-spin interactions within the molecule are a potential source of signal modulation. These interactions take place in an unusual environment in which the external gradient of $\sim 100$ Gauss/Å modulates spin-spin interactions. Qualitatively, the gradient will cause localization of the spin eignestates of the collective system, thereby suppressing long-range propagation of spin waves. This would increase the spin decay time time $T_2$.

It is apparent that image generation from data collected by oscillator-based detection of nuclear magnetic resonance closely resembles the task of image generation from data collected by inductor-based detection of nuclear magnetic resonance in medical imaging. In both cases the collected data can be modulated by a multiplicity of means. Provided that the modulations are controlled and recorded during data collection, then the recorded information about the modulation can be combined with the recorded magnetic resonance signal to allow image reconstruction.

CLASSICAL AND QUANTUM THEORY

To derive the equations used in Designs 1-12 as presented in Tables 1, 2, and 3, it is convenient to consider a system made up of three elements: (1) a harmonic oscillator, (2) a spin one-half particle (nominally a proton) mounted on the oscillator, (3) an externally applied magnetic field. The magnetic moment of the particle will create a coupling between the field and the oscillator. How strong is the coupling? What is the dynamic behavior of the coupled system? It will be shown in what follows that, under the proper conditions, the coupling is sufficiently strong that magnetic resonance imaging of single nuclei is feasible.

It will be appreciated that the dynamical theory of harmonic oscillators and spin one-half particles is well-established, and described in many textbooks [16], and that the invention described herein operates in accordance with accepted physical laws.

Let $\omega$ be the resonant frequency of the mechanical oscillator, and m the oscillator mass. We adopt units $\hbar = \omega = m = 1$. The external magnetic field $\vec{B}(\vec{x}, t)$ is assumed to have a uniform component, a time-dependent component, and a gradient component, $$\vec{B}(\vec{x},t) = \vec{B}_c + \vec{B}_t \cos(t) + G\vec{x} \quad (21)$$

with $\vec{B}_c$, $\vec{B}_t$, and G constant. Because $\vec{B}$ is divergence-free and curl-free, the gradient matrix G is symmetric with zero trace. In physical terms, $\vec{B}_c$ tunes the resonance, $\vec{B}_t$ provides motive power, and G couples the spin to the oscillator motion.

After transforming to a frame rotating about the $\vec{B}_c$ axis with unit frequency, then moving to an interaction picture with the unperturbed quantum oscillator as the zeroth order Hamiltonian, and keeping only the secular terms (justified in what follows), the resulting Hamiltonian is [16]

$$H = -\tfrac{1}{2}\delta\cdot\sigma_z - \tfrac{1}{2}\epsilon\cdot\sigma_x + \tfrac{1}{2}\beta P\cdot\sigma_x - \tfrac{1}{2}\beta X\cdot\sigma_y. \quad (22)$$

Here X and P are the operator components of the oscillator amplitude, satisfying $[X,P]=i$. The mechanical energy $E_{mech}$ of the oscillator is $\tfrac{1}{2}[P^2+X^2]$. $\{\sigma_x,\sigma_y,\sigma_z\}$ are Pauli matrices with $[\sigma_x,\sigma_y]=2i\sigma_z$. The dimensionless constants $\delta$, $\epsilon$, and $\beta$ are:

$$\delta = |\vec{B}_c|/B_0 - 1 \quad (23)$$

$$\epsilon = \tfrac{1}{2}|(I-\hat{z}\otimes\hat{z})\cdot\vec{B}_t|/B_0 \quad (24)$$

$$\beta = [\hbar\omega/(m\omega^2 L^2)]^{\frac{1}{2}} \quad (25)$$

with $B_0$ the field strength needed to flip spins at the resonant frequency, $\hat{z} = \vec{B}_c/|\vec{B}_2|$ the direction of the field, $L \equiv B_0/|(I-\hat{z}\otimes\hat{z})\cdot G\cdot\hat{n}|$ a length-scale characteristic of the gradient, with $\hat{n}$ the axis of oscillator motion.

To get a feel for these parameters, assume $B_c = 1$ Tesla, so the precession frequency $\omega$ is $2.675\cdot 10^8$ rad/s. Further assume that the system is on-resonance, i.e. $\delta = 0$, and that the gradient length scale is short, $L = 1000$ Å. For the mass of the oscillator take $m = 2.37\cdot 10^6$ a.m.u., equivalent to about twenty thousand amino acids. These parameters give $\beta = 10^{-4}$. We will soon find that a reasonable time-dependent field strength is $\epsilon = 10^{-3}$, i.e. 10 Gauss. The secular approximation used in deriving the rotating-frame Hamiltonian ignores terms of order $\delta e^{it}$, $\epsilon e^{it}$, and $\beta e^{it}$, which is reasonable for $\delta, \epsilon, \beta \ll 1$, as above.

The classical equation of motion for $<\vec{\sigma}>$ is:

$$\frac{d<\vec{\sigma}>}{dt} = \vec{\Omega}\times<\vec{\sigma}>, \quad (26)$$

with the precession vector $\vec{\Omega}$ given by $$\vec{\Omega} = \tfrac{1}{2}\beta[<P>-2\epsilon/\beta]\hat{x} - \tfrac{1}{2}\beta<X>\hat{y} - \delta\hat{z} \quad (27)$$

Thus $\vec{\Omega}$ generates Rabi precession of the spins, with the terms $\beta<P>\hat{x}/2$ and $\beta<X>\hat{y}/2$ reflecting the motion of the oscillator in the field gradient.

It is convenient to regard $\vec{\Omega}$ as the primary dynamical variable of the system, because if $\vec{\Omega}$ is known then $<P>$ and $<X>$ are known and vice versa. The spin operator $\sigma$ can be separated into components $\vec{\sigma}_{par}$ and $\vec{\sigma}_{perp}$, parallel to and perpendicular to $\vec{\Omega}$. The adiabatic theorem [17] implies that if the system stars in a state with $<\vec{\sigma}_{par}> = \kappa\vec{\Omega}$, then $<\vec{\sigma}_{par}> = \kappa\vec{\Omega}$ at all later times as well, so that $\kappa$ is an (approximate) constant of the motion.

In the classical equation of motion for $\vec{\Omega}$, the terms proportional to $<\vec{\sigma}_{perp}>$ oscillate with frequency $|\vec{\Omega}|$, and can be neglected in a secular approximation. Thus $<\vec{\sigma}> \approx <\vec{\sigma}_{par}> \approx \kappa\vec{\Omega}$, and we find $$\frac{d\vec{\Omega}}{dt} = \tfrac{1}{8}\beta^2\kappa\,\hat{\Omega}\times\hat{z} \quad (28)$$

This tells us that $|\vec{\Omega}|$ is constant, and its projection in the $\hat{x}$-x plane orbits with angular velocity $\omega_{orbit} = \tfrac{1}{8}\beta^2\kappa/|\vec{\Omega}|$. For initial states with $<P> = <X> = 0$, $\omega_{orbit} = \tfrac{1}{8}\beta^2/(\epsilon^2+\delta^2)^{\frac{1}{2}}$, and the oscillator alternately gains and loses mechanical energy $E_{mech} = 8\epsilon^2/\beta^2$. For $\epsilon/\beta = 10$ (as in the example above), the oscillator reaches occupation number $<n> = 800$, well into the classical regime.

An exact quantum calculation shows that the classical description is quite accurate. We will use three different basis sets to solve the quantum equations. The initial state is conveniently specified in the familiar "harmonic" basis $\{|n\uparrow>,|n\downarrow>; n=0,1,2\ldots\}$, which is generated by the usual raising and lowering operators. The time evolution is computed by transforming to a shifted basis (defined below) $\{|n_s\uparrow>,|n_s\downarrow>; n_e=0,1,2\ldots\}$, and then further transforming to an eigenstate basis (also defined below) $\{|n_e+>,|n_e->; n_e=0,1,2\ldots\}$.

The shifted basis is defined in terms of the shifted amplitude operator $P_s \equiv P - 2\epsilon/\beta$, and the raising and lowering operates $a_s^\pm \equiv [P_s \pm \iota X]/\sqrt{2}$. Then $[a_s^-, a_s^+] = 1$ (as usual). The Hamiltonian takes a simple form in the shifted basis $$H = \tfrac{1}{2}\delta\cdot\sigma_z + \frac{1}{2\sqrt{2}}\beta[\sigma^+ a_s^+ + \sigma^- a_s^-], \quad (29)$$

with the spin raising and lowering operators $\sigma^\pm \equiv \tfrac{1}{2}[\sigma_x \pm \iota\sigma_y]$ satisfying $[\sigma^+,\sigma^-] = 2\sigma_z$.

A complete set of shifted states $|n_s\uparrow>$ and $|n_s\downarrow>$ can be constructed using $a_s^-|0_s\uparrow> = a_s^-|0_s\downarrow> = 0$ and $a_s^+|n_s\updownarrow> = \sqrt{n_s+1}|n+1_s\updownarrow>$ (here $|\updownarrow>$ is used to indicate spin quantum numbers are unaffected). The states $|k\updownarrow>$ in the harmonic basis (in which the initial state is specified) transform to the shifted basis according to $$|k\updownarrow> = e^{-\epsilon^2/\beta^2}\sum_{n_s=0}^{\infty}\frac{(-\sqrt{2}\,\epsilon/\beta)^{n_s}}{(n_s!k!)^{\frac{1}{2}}}\left(a_s^+ + \sqrt{2}\,\frac{\epsilon}{\beta}\right)^k|n_s\updownarrow> \quad (30)$$

For fixed k and large $\epsilon/\beta$, the distribution of quantum numbers $n_s$ defined by $P(n_2) \equiv |<k\updownarrow|n_s\updownarrow>|^2$ is asymptotimically normal, with mean and variance $<n_2> = 2\epsilon^2/\beta^2$, so that a finite number of shifted states suffices for practical numerical work.

The eigenstates $|n_e\pm>$ of the Hamiltonian occur in opposite-sign pairs, with $H|n_e\pm> = \pm\lambda_n|n_e\pm>$. The eigenstates take a simple form in the shifted basis:

$$|n_e\pm> = [|n_s\uparrow> + \alpha_\pm|(n-1)_s\downarrow>]/(1+\alpha_\pm^2)^{\frac{1}{2}}, \quad (31)$$

with mixing amplitude $\alpha_\pm$ and eigenvalues $\lambda_n$ given by $$\alpha_\pm = (\pm 2\lambda_n + \delta)/(\beta\sqrt{n/2}) \quad (32)$$

$$\lambda_n = \tfrac{1}{2}(\delta^2 + \beta^2 n_e/2)^{\frac{1}{2}}. \quad (33)$$

The shifted basis does not contain $|-1_s\downarrow\rangle$, so the $|O_3+\rangle$ eigenstate is not defined. The eigenstates are a complete set even without $|O_s+\rangle$.

The eignefrequencies $\lambda_n$ are irrational, so the quantum dynamics cannot be exactly periodic, in contrast to the classical dynamics. Expanding the n-dependence of $\lambda_n$ about $n=\langle n_s\rangle$ yields $$\lambda_n \approx \frac{1}{2}(\epsilon^2+\delta^2)^{1/2} + \frac{(n-\langle n_s\rangle)\beta^2}{8(\epsilon^2+\delta^2)^{1/2}} - \frac{(n-\langle n_s\rangle)^2\beta^4}{64(\epsilon^2+\delta^2)^{3/2}}. \quad (34)$$

The first order corrections generate a periodic time dependence with the same frequency $\omega_{orbit}$ obtained previously. This is why the classical-adiabatic approximation works well. The second order corrections cause phase decorrelation at times $\omega_{orbit}t \gg (\epsilon^2+\delta^2)/(\epsilon\beta)$, and the subsequent evolution of $\langle X\rangle$ and $\langle P\rangle$ eventually becomes disordered.

Figure 4:
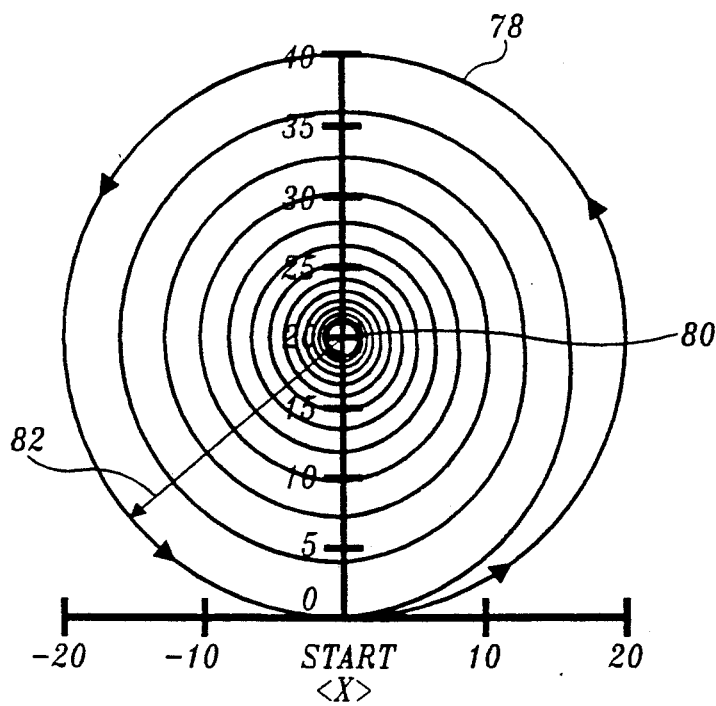
FIG. 4 is a graph of phase space evolution with $<X>$ represented by the X-axis and $<P>$ represented by the Y-axis.
Figure 5:
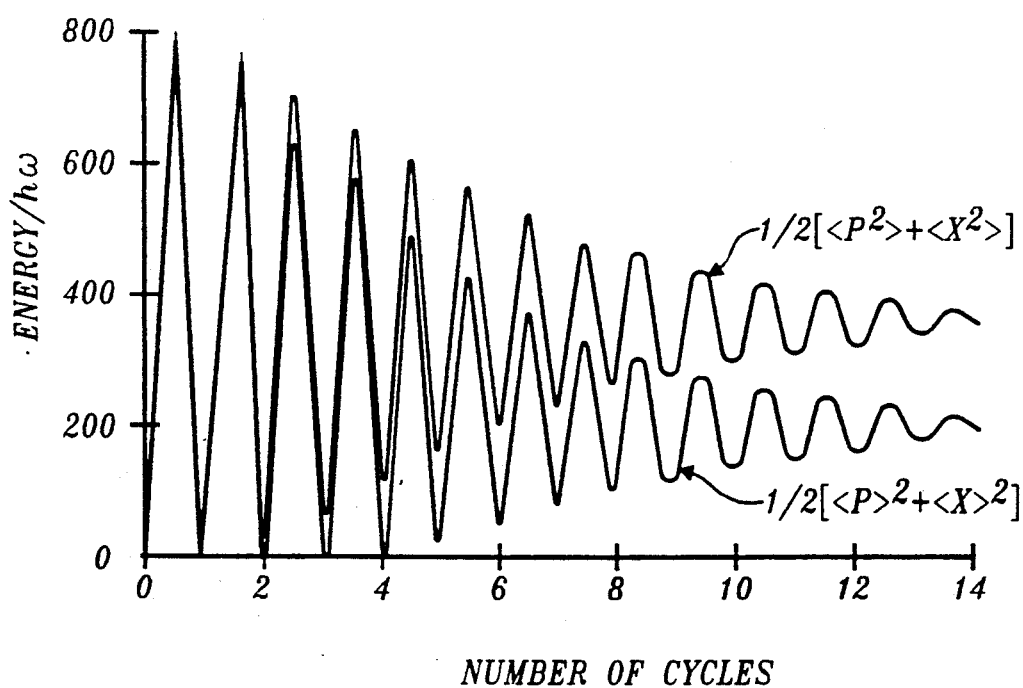
FIG. 5 is a graph of energy evolution with the number of cycles represented along the X-axis and energy represented along the Y-axis.

FIGS. 4 and 5 show exact quantum mechanical results for the previously discussed case $\epsilon=10^{-3}$, $\beta=10^{-4}$, $\epsilon=0$. The initial state is $(|O\uparrow\rangle + |O\downarrow\rangle)/\sqrt{2}$, so that $\langle P\rangle = \langle X\rangle = 0$ initially, $\vec{\Omega} = -\epsilon\hat{x}$, and $\kappa=-1$. The classical-adiabatic equations accurately predict the phase space trajectory to be a circle 78 in the $\langle P\rangle - \langle X\rangle$ plane as shown in FIG. 4, wherein $\langle X\rangle$ is plotted along the X-axis and $\langle P\rangle$ is plotted along the Y-axis) with center 80 at $\langle P\rangle = 2\epsilon/\beta = 20$ and $\langle X\rangle = 0$, radius 82 of $2\epsilon/\beta = 20$, and orbital period $16\pi(\epsilon^2+\delta^2)^{\frac{1}{2}}/\beta^2 = 16\pi 10^5$. The oscillator reaches a maximal excitation of $\langle n\rangle_{max} = 8\epsilon^2/\beta^2 = 800$ (as shown in FIG. 5, wherein the number of cycles is shown along the X-axis and the energy is shown along the Y-axis). Phase decorrelation becomes appreciable for $\omega_{orbit}t \gg 10$ (i.e. $N_{orbit} \gg 10/2\pi$), as expected. The phases become fully randomized after $\sim 400$ orbits (more than shown here), and the energy then fluctuates about $\langle n\rangle = 4\epsilon^2/\beta^2$.

At late times the quantum state of FIG. 5 has no classical counterpart, because $\langle P\rangle^2 + \langle X\rangle^2$ is different from $\langle P^2\rangle + \langle X^2\rangle$ by a factor of two. Another example of non-classical behavior can be generated by using $|O\uparrow\rangle$ as the initial state. Then $\kappa=0$ in the classical-adiabatic approximation, and the classical equations predict $\langle P\rangle = \langle X\rangle = 0$ at all times. The quantum equations give a quite different result: for any initial spin state the energy evolution is as shown in FIG. 5. This is because any spin state is a linear superposition of states with $\kappa=1$ and $\kappa=-1$. The $\kappa=-1$ states evolve independently, tracing opposing circles in the $\langle P\rangle - \langle X\rangle$ plane, and their energies are additive to a good approximation.

The following thought experiment suggests a way to reconcile the classical and quantum descriptions. Suppose the system is prepared with the oscillator in the ground state, and the spin in some mixed state (i.e. $\kappa$ between $-1$ and $1$). Further suppose that the oscillator is completely isolated from the external world, neither in contact with a heat bath, nor monitored classically, so that a purely quantum description is appropriate. Then the magnetic field is switched on. After a time $\omega_{orbit}t = \pi/2$ (one-quarter orbit in the $\langle X\rangle - \langle P\rangle$ phase plane) the oscillator will be excited to a state with $\langle n\rangle \approx 4\epsilon^2/\beta^2$, regardless of the initial spin state.

It is not yet determined whether the system is evolving clockwise or counterclockwise in the $\langle X\rangle - \langle P\rangle$ phase plane, because the state vector contains a mixture of these two possibilities. If we perform a classical measurement of $\langle X\rangle$ and $\langle P\rangle$ (to within the limits imposed by the uncertainty principle), the correspondence principle requires that the state vector be "reduced" to one possibility or the other, either $\langle X\rangle \approx 2\epsilon/\beta$ and $\kappa=-1$ (counterclockwise orbit as in FIG. 4), or $\langle X\rangle = -2\epsilon/\beta$ and $\kappa-1$ (clockwise orbit).

This thought experiment (which could be carried out with a suitable apparatus) suggests that only states with $\kappa=1$ or $\kappa=-1$ are observable when the oscillator state is monitored classically.

A more rigorous analysis would introduce an external quantum heat bath in interaction with the oscillator system. This would define a specific mechanism for wave packet reduction, for oscillator damping, and for spontaneous transitions between $\kappa=1$ and $\kappa=-1$ states.

Damping can be modeled phenomenologically by adding a term to the equations of motion:

$$\frac{d\vec{\Omega}}{dt} = \frac{\beta^2}{8}\kappa\hat{z}\times\vec{\Omega} - \frac{1}{2Q}[\vec{\Omega}-\vec{\Omega}_0], \quad (35)$$

where Q is the quality factor and $\vec{\Omega}_0 = -\epsilon\hat{x}-\delta\hat{z}$. This form is determined by requiring that $\langle P\rangle$ and $\langle X\rangle$ evolve classically in the absence of a driving force.

The equilibrium solutions of the damped equations ($\vec{\Omega}$ constant) represent states with continuous power flow $\langle n\rangle/Q$ into the oscillator. It is readily shown that all equilibria lie on a circle of radius $\epsilon/2\beta$ in the $\langle P\rangle - \langle X\rangle$ plane, centered at $\langle P\rangle = \epsilon/2\beta$ and $\langle X\rangle = 0$. The occupation number $\langle n\rangle$ at equilibrium is:

$$\beta^2\langle n\rangle = \epsilon^2+\epsilon_{crit}^2+\delta^2-[(\epsilon^2+\epsilon_{crit}^2+\delta^2)^2-4\epsilon^2\epsilon_{crit}^2]^{\frac{1}{2}} \quad (36)$$

with $\epsilon_{crit} = \beta^2 Q/4$. For $\epsilon \geq \epsilon_{crit}$ and $\delta=0$ (resonant tuning), we find $\langle n\rangle = \beta^2 Q^2/8$. For $\epsilon < \epsilon_{crit}$ we find $\langle n\rangle = 2\epsilon^2/\beta^2$.

There is no practical advantage in applying fields with $\epsilon > \epsilon_{crit}$, because the oscillator energy is not thereby increased. On the other hand, for $\epsilon > \epsilon_{crit}$ the system has reduced energy at equilibrium, and (as can be shown) undergoes oscillations before settling to equilibrium. Thus $\epsilon = \epsilon_{crit}$ is a natural setting.

The power absorbed in the oscillator is $W_{max} = \langle n\rangle/Q = \beta^2 Q/8$. This saturates a physical limit, because the time-dependent field exerts a maximal torque $\epsilon/2$ on the particle, so the maximal power transfer is $\epsilon/2$ (in units with $\omega=1$). For $\epsilon=\epsilon_{crit}=\beta^2 Q/4$ we recover $W_{max} = \beta^2 Q/8$.

In summary, it has been shown that energy transfer into the oscillator is maximal when there is a three-fold resonance between the spin precession frequency, the resonant frequency of the oscillator, and the frequency of the time-dependent field. When the external field strength is adjusted to $\epsilon=\epsilon_{crit}$, the spin-mediated electromechanical coupling achieves unit quantum efficiency.

Spin-mediated electromechanical coupling has an unusual scaling behavior at small spatial dimensions; the available signal power increases as the oscillator is made smaller. More precisely, as the extrinsic apparatus parameters m and L are made smaller, with the intrinsic parameters Q and $\omega$ held constant, power transfer into the oscillator scales as $m^{-1}L^{-2}$. This makes spin-mediated electromechanical coupling well suited for small-scale magnetic resonance imaging.

Detectable signals can be generated from individual protons by virtue of the $L^{-2}$ scaling and the high quantum efficiency of spin-mediated electromechanical coupling. The intrinsic spatial resolution is of order $\epsilon L$, which for a suitable design can be less than an Angstrom.

OTHER EMBODIMENTS

While preferred embodiments of the invention have been illustrated and described, it will be appreciated that various changes can be made therein without departing from the spirit and scope of the invention.

For example, under some circumstances it may be desirable to operate the invention so that nuclei other than protons are in a state of magnetic resonance. Two particularly suitable nuclei are $C^{13}$ and $N^{14}$. $C^{13}$ is rare in nature, with natural abundance of about 1%. Organic compounds may be selectively enriched in $C^{13}$, so that only a selected portion of of the molecule is detected. $N^{14}$ is of particular interest because both ribonucleic acid (RNA) and deoxyribonucleic acid (DNA) contain a "backbone" of nitrogen-containing compounds, so that a knowledge of nitrogen structure along suffices to determine the gene sequence of these compounds. $N^{14}$ is less abundant than either hydrogen or carbon, and thus poses fewer difficulties in resolving the spatial positions of adjacent atoms. The method and system described herein could therefore fine a applications in sequencing the genetic code.

$N^{14}$ is different from the nuclei previously described in that it has unit spin, rather than spin one-half. A single $N^{14}$ nucleus, when scanned, may experience a quantum reduction to one of three spin states, corresponding to $\kappa$ equal to 1, 0, or $-1$. The $\kappa=0$ spin state would not mechanically excite the oscillator, but could be "flipped" to a $\kappa=1$ or $\kappa=-1$ state by appropriate modulations of the applied magnetic fields of the type previously described.

If we imagine a human genome of $3 \times 10^9$ DMA base pairs laid out on an oscillating substrate as in FIG. 3, the time necessary to sequence the genome is readily estimated. Assuming an equilibrium time of one millisecond for a measurement, and that ten $N^{14}$ measurements suffice to determine a base pair, then 100 base pairs per second will be sequenced, and it will take about 350 days to determine the entire genome. If we accelerate the sequencing by affixing a $32 \times 32$ array of oscillators to the scanhead, and assume a 10% utilization of each oscillator, then sequencing an entire human genome will require 3 to 4 days. By affixing more oscillators, a proportionate gain in sequencing speed can be attained.

For this reason, in a further embodiment of the apparatus of FIG. 3, multiple oscillators are affixed to the motion control mechanism. Each oscillator has its own independent mechanism for fine-tuning its position, in order to avoid oscillator-substrate collisions such as might be generated by minute substrate irregularities, and in order that each oscillator might more effectively scan the local spatial structure of the molecules of interest, and in order that each oscillator might independently generate spin flips, by the means described in previous sections. Also, each oscillator has its own independent means for detecting its mechanical excitation, as described in previous sections.

REFERENCES

1. A. Wlodawer, M. Miller, M. Jaskolski, B. K. Santhyanarayana, Science 245, 616–621 (1989)
2. V. E. Bottom, *Introduction to Quartz Crystal Unit Design*, Van Nostrand Reinhold, New York, 1982. See chapters 6 and 7.
3. G. Binnig et al., Phys. Rev. Lett. 49, 57 (1982)
4. T. Sleator, E. L. Hahn, M. B. Heaney, C. Hilbert, and J. Clarke, Phys. Rev. B .38, 8609 (1988)
5. T. Matsuda et al., Phys. Rev. Lett. 62, 2519 (1989)
6. H. F. Hess, R. B. Robinson, and J. V. Waszczak, Phys. Rev. Lett. 64, 2711 (1990)
7. See many tests, e.g., J. R. Reitz and F. J. Milford, *Foundations of Electromagnetic Theory*, Addison-Wesley, New York, 1967, pp 213
8. W. P. Mason, *Electromechanical Transducers and Wave Filters*, Van Nostrand, New York 1942, pp 90.
9. M. F. Bocko, Rev. Sic. Instrum, 61, 3763 (1990)
10. B. Yurke and G. P. Kichanski, Phys. Rev. B 41, 8184 (1990)
11. K. K. Likharev, IBM J. Res. Develop. 32, 144 (1988)
12. S. H. Moseley et al., IEEE Trans. Nucl. Sci. 35, 59 (1988)
13. B. Sadoulet, IEEE Trans. Nucl. Sci. 35, 47 (1988)
14. N. Wang et al., IEEE Trans. Nucl. Sci. 35, 55 (1988)
15. "Phonography" in *Encyclopedia Brittancia*, Vol. 17, William Benton, New York, Vol 17, page 917 (1971).
16. see, e.g., M. Weissbluth, *Photon-Atom Interactions*, Academic Press, New York, (1989). Characters 2 and 3 describe the transforms used to obtain the Hamiltonian.
17. A. Messiah, *Quantum Mechanics*, John Wiley and Sons, New York (1966). See chapter 17 for a discussion of the adiabatic theorem.

TABLE 1

| Four embodiments of a device as illustrated in FIG. 1. | | | | | |
|---|---|---|---|---|---|
| The first six parameters determine the macrodevice (see FIG. 1) characteristics | | | | | |
| Device Parameters | Symbol | Design #1 | Design #2 | Design #3 | Design #4 |
| 1. temperature | T | 0.03 K | 3 K | 3 K | 90 K |
| 2. constant B field | $B_c$ | 1 Tesla | 1 Tesla | 1 Tesla | 1 Tesla |
| 3. gradient length scale | L | 10 mm | 10 mm | 100 mm | 10 mm |
| 4. oscillator quality factor | Q | $10^5$ | $10^5$ | $10^5$ | $10^5$ |
| 5. sample thickness | h | $10\mu$ | $10\mu$ | $10\mu$ | $10\mu$ |
| 6. sample diameter | d | 1 mm | 1 mm | 1 mm | 1 mm |
| The remaining macrodevice parameters are defined in terms of the first five | | | | | |
| | Equation | Design #1 | Design #2 | Design #3 | Design #4 |
| Crystal Parameters | | | | | |
| 7. resonant frequency $\omega$ | $= \gamma B_c$ | 42.58 MHz | 42.58 MHz | 42.58 MHz | 42.58 MHz |
| 8. crystal thickness $\theta$ | $= \pi v/\omega$ | $46\mu$ | $46\mu$ | $46\mu$ | $46\mu$ |
| Quantum Parameters | | | | | |
| 9. spin-oscillator coupling $\beta$ | $= (\hbar \omega/m \omega^2 L^2)^{\frac{1}{2}}$ | $2.87 \cdot 10^{-16}$ | $2.87 \cdot 10^{-16}$ | $2.87 \cdot 10^{-16}$ | $2.87 \cdot 10^{-16}$ |
| 10. number of spins $n_{spin}$ | see text | $1.79 \cdot 10^{16}$ | $1.79 \cdot 10^{14}$ | $1.79 \cdot 10^{14}$ | $5.97 \cdot 10^{12}$ |

TABLE 1-continued

Four embodiments of a device as illustrated in FIG. 1.

| | | | | | |
|---|---|---|---|---|---|
| 11. mean occupation number $<n>$ | $n_{spin}^2 \beta^2 Q^2/8$ | $3.29 \cdot 10^{10}$ | $3.29 \cdot 10^6$ | $3.29 \cdot 10^4$ | $3.66 \cdot 10^3$ |
| Signal Parameters | | | | | |
| 12. response time $\tau$ | $= Q\omega^{-1}$ | 0.37 msec | 0.37 msec | 0.37 msec | 37 msec |
| 13. oscillation amplitude | $= n_{spin} \beta^2 QL/2$ | $7.36 \cdot 10^{-3}$ Å | $7.36 \cdot 10^{-3}$ Å | $7.36 \cdot 10^{-6}$ Å | $2.45 \cdot 10^{-6}$ Å |
| 14. oscillator energy | $= <n> \hbar \omega$ | $9.29 \cdot 10^{-16}$ J | $9.29 \cdot 10^{-20}$ J | $9.29 \cdot 10^{-22}$ J | $1.03 \cdot 10^{-22}$ J |
| 15. ... in units of kT | $= "..."$ | $2.24 \cdot 10^9$ kT | $2.24 \cdot 10^3$ kT | $2.24 \cdot 10^1$ kT | $8.31 \cdot 10^{-2}$ kT |
| 16. piezoelectric signal | see text | 5220 μV | 52 μV | 5.2 μV | 1.7 μV |

TABLE 2

Four embodiments of a device as illustrated in FIG. 2.

The first five parameters determine the microdevice (see FIG. 2) characteristics

| Device Parameters | Symbol | Design #5 | Design #6 | Design #7 | Design #8 |
|---|---|---|---|---|---|
| 1. temperature | T | 20 mK | 20 mK | 20 mK | 20 mK |
| 2. constant B field | $B_c$ | 10 Tesla | 10 Tesla | 1 Tesla | 1 Tesla |
| 3. gradient length scale | L | 100 Å | 100 Å | 1000 Å | 1000 Å |
| 4. oscillator mass | m | $10^6$ amu | $10^8$ amu | $10^6$ amu | $10^8$ amu |
| 5. oscillator quality factor | Q | $10^5$ | $10^5$ | $10^5$ | $10^7$ |

The remaining microdevice parameters are defined in terms of the first five

| | Equation | Design #5 | Design #6 | Design #7 | Design #8 |
|---|---|---|---|---|---|
| Drive Parameters | | | | | |
| 6. drive frequency $\omega$ | $= \gamma B_c$ | 425.8 MHz | 425.8 MHz | 42.58 MHz | 42.58 MHz |
| 7. field strength $B_t$ | $= \beta^2 QB_c/4$ | 1187 Gauss | 11.9 Gauss | 11.9 Gauss | 11.9 Gauss |
| Quantum Parameters | | | | | |
| 8. spin-oscillator coupling $\beta$ | $= (\hbar \omega/m \omega^2 L^2)^{\frac{1}{2}}$ | $4.87 \cdot 10^{-4}$ | $4.87 \cdot 10^{-5}$ | $1.54 \cdot 10^{-4}$ | $1.54 \cdot 10^{-5}$ |
| 9. field coupling $\epsilon$ | $= B^2 Q/4$ | $5.94 \cdot 10^{-3}$ | $5.94 \cdot 10^{-5}$ | $5.94 \cdot 10^{-4}$ | $5.94 \cdot 10^{-4}$ |
| 10. mean occupation number $<n>$ | $= \beta^2 Q^2/8$ | 297 | 3 | 30 | 2968 |
| Signal Parameters | | | | | |
| 11. response time $\tau$ | $= Q\omega^{-1}$ | 0.037 msec | 0.037 msec | 0.37 msec | 37 msec |
| 12. spatial resolution $L_{res}$ | $= \beta^2 QL/4$ | 0.59 Å | 0.01 Å | 0.59 Å | 0.59 Å |
| 13. thermal power W | $= \hbar \omega^2 \beta^2 Q/8$ | $2.2 \cdot 10^{-18}$ J/s | $2.2 \cdot 10^{-20}$ J/s | $2.2 \cdot 10^{-21}$ J/s | $2.2 \cdot 10^{-21}$ J/s |
| 14. ... in units of $\hbar \omega$/msec | $= "..."$ | 7939 $\hbar\omega$/msec | 79 $\hbar\omega$/msec | 79 $\hbar\omega$/msec | 79 $\hbar\omega$/msec |
| 15. ... in units of kT/msec | $= "..."$ | 8111 kT/msec | 81 kT/msec | 8.1 kT/msec | 8.1 kT/msec |

TABLE 3

Four embodiments of a device as shown in FIG. 3.
The first four parameters determine the microdevice (see FIG. 3) characteristics

| | | Design #9 | Design #10 | Design #11 | Design #12 |
|---|---|---|---|---|---|
| Magnetic Field | | | | | |
| 1. field magnitude $B_c$ | [input] | 0.66 T | 3.33 T | 11.33 T | 11.33 T |
| 2. gradient scale L | [input] | 20 Å | 50 Å | 170 Å | 170 Å |
| Oscillator | | | | | |
| 3. motional mass m | [input] | $10^{11}$ amu | $10^{10}$ amu | $10^9$ amu | $10^6$ amu |
| 4. quality factor Q | [input] | $10^7$ | $10^7$ | $10^7$ | $3 \times 10^5$ |
| 5. resonant frequency $\omega$ | $= \gamma \beta_c$ | 28.4 MHz | 142 MHz | 482 MHz | 482 MHz |
| 6. prong length h | for quartz | 3028 nm | 1004 nm | 388 nm | 98 nm |
| 7. prong width t | for quartz | 290 nm | 159 nm | 81 nm | 5.1 nm |
| 8. gradient coupling $\beta$ | $= [\hbar/m\omega L^2]^{\frac{1}{2}}$ | $2.98 \times 10^{-5}$ | $1.69 \times 10^{-5}$ | $8.51 \times 10^{-6}$ | $2.69 \times 10^{-4}$ |
| Substrate Motion | | | | | |
| 9. critical amplitude A | $= \beta^2 QL/2$ | 0.089 Å | 0.071 Å | 0.062 Å | 1.85 Å |
| Oscillator Signal | | | | | |
| 10. quantum number $<n>$ | $= \beta^2 Q^2/8$ | 11130 | 3561 | 906 | 815 |
| 11. mechanical energy E | $= <n> \hbar \omega$ | $2.09 \times 10^{-22}$ J | $3.35 \times 10^{-22}$ J | $2.90 \times 10^{-22}$ J | $2.61 \times 10^{-22}$ J |
| 12. ... in kT @ 4.2° K. | $= E/kT$ | 3.6 | 5.8 | 5.0 | 4.5 |
| 13. equilibrium time $\tau$ | $= Q/\omega$ | 56.1 msec | 11.2 msec | 3.30 msec | 0.10 msec |
| Piezo Signal | | | | | |
| 14. capacitance C | $= 4.5 \epsilon_o h$ | $1.20 \times 10^{-4}$ pF | $4.00 \times 10^{-5}$ pF | $1.54 \times 10^{-5}$ pF | $3.88 \times 10^{-6}$ pF |
| 15. peak voltage V | $= [2r^2 E/C]^{\frac{1}{2}}$ | 186 μV | 409 μV | 612 μV | 1159 μV |
| 16. charge/cycle q | $= [2r^2 E/C]^{\frac{1}{2}}$ | 0.140 $\theta$ | 0.102 $\theta$ | 0.059 $\theta$ | 0.028 $\theta$ |

The embodiments of the invention in which an exclusive property or privilege is claimed are defined as follows:

1. A system for transferring energy to a mechanical oscillator, the system comprising:
   a mechanical oscillator having a natural frequency of oscillation;
   a material containing nuclear spins, in proximity to the mechanical oscillator;
   means for applying a substantially time independent magnetic field to said material, such that said material has a spin precession frequency that is approximately resonant with the natural frequency of the mechanical oscillator;
   means for applying a time dependent magnetic field to said material, the time dependent magnetic field oscillating at a field frequency that is approximately resonant with said spin precession frequency;

means for applying a magnetic field gradient to said material, such that mechanical energy is transferred to the mechanical oscillator, causing it to oscillate at its natural frequency; and means for detecting the oscillation of the mechanical oscillator.

2. The system of claim 1, wherein said material is fixed to the mechanical oscillator.

3. The system of claim 1, wherein the means for applying a magnetic field gradient is affixed to the mechanical oscillator.

4. The system of claim 1, wherein said time independent magnetic field is generated at least in part by a persistent vortex of magnetic flux trapped in a superconducting substance.

5. The system of claim 1, wherein said magnetic field gradient is generated at least in part by a persistent vortex of magnetic flux trapped in a superconducting substance.

6. The system of claim 1, wherein said time dependent magnetic field is generated at least in part by motion of persistent vortex of magnetic flux trapped in a superconducting substance.

7. The system of claim 1, wherein said time independent magnetic field is generated at least in part by a magnetic substance.

8. The system of claim 1, wherein said magnetic field gradient is generated at least in part by a magnetic substance.

9. The system of claim 1, wherein said time dependent magnetic field is generated at least in part by motion of magnetic substance.

10. The system of claim 1, wherein said means for applying a time dependent magnetic field comprises a substrate to which said material containing nuclear spins is affixed and means for causing the substrate to oscillate.

11. The system of claim 1, wherein the means for detecting the oscillation of the mechanical oscillator comprises means for detecting heat produced by said oscillation.

12. The system of claim 1, wherein the mechanical oscillator comprises a piezoelectric substance, such that said motion of the mechanical oscillator creates an electrical signal in the piezoelectric substance, and wherein the means for detecting the oscillation of the mechanical oscillator comprises means for detecting said electrical signal.

13. The system of claim 1, further comprising a substrate to which said material containing nuclear spins is affixed, a magnetic substance affixed to the mechanical oscillator, means for moving the mechanical oscillator with respect to the substrate, and means for detecting the oscillation of the mechanical oscillator as a function of the position of the mechanical oscillator with respect to the substrate, the magnetic substance comprising the means for applying the substantially time independent magnetic field and the magnetic field gradient, and the motion of the substrate combined with the motion of the magnetic substance attached to the oscillator providing the means for applying the time dependent magnetic field.

14. The system of claim 1, wherein said material containing nuclear spins is affixed to the mechanical oscillator, wherein the means for applying the time independent magnetic field and the magnetic field gradient comprises magnetic field generating means affixed to a scanhead, and wherein the system further comprises means for causing the scanhead to oscillate to thereby applying the time dependent magnetic field to said material, and means for detecting the oscillation of the mechanical oscillator as a function of the position of the scanhead.

15. The system of claim 14, wherein the magnetic field generating means comprises a persistent vortex of magnetic flux trapped in a superconducting substance.

16. A method for transferring energy to a mechanical oscillator, the mechanical oscillator having a natural frequency of oscillation, the method comprising:

positioning a material containing nuclear spins in proximity to the mechanical oscillator;

applying a substantially time independent magnetic field to said material, such that said material has a spin precession frequency that is approximately resonant with the natural frequency of the mechanical oscillator;

applying a time dependent magnetic field to said material, the time dependent magnetic field oscillating at a field frequency that is approximately resonant with said spin precession frequency;

applying a magnetic field gradient to said material, such that mechanical energy is transferred to the mechanical oscillator, causing it to oscillate at its natural frequency; and detecting the oscillation of the mechanical oscillator.

17. The system of claim 13, wherein a plurality of oscillators is employed, each oscillator comprising individual means for moving the individual oscillator, such that each individual oscillator independently detects the presence of magnetic resonance in that portion of said sample which is near to each individual oscillator.

18. The system of claim 1, wherein the means for detecting comprises an inductive loop placed in proximity to the mechanical oscillator, such that said motion of said oscillator induces an electrical signal in said inductive loop, and wherein the means for detecting the oscillation of the mechanical oscillator comprises means for detecting said electrical signal.

19. The system of claim 1, wherein the mechanical oscillator comprises one element of an optical interferometer, and such that said motion of said oscillator induces a change in the rate at which light passes through said interferometer, and wherein the means for detecting the oscillation of the mechanical oscillator comprises means for detecting said rate at which light passes through said interferometer.

20. The system of claim 1, wherein the mechanical oscillator comprises one arm of an optical lever arm, and a beam of light is shined onto the mechanical oscillator, such that said motion of said oscillator causes an angular deflection of said beam of light, and wherein the means for detecting the oscillation of the mechanical oscillator comprises means for detecting said angular deflection.

21. The system of claim 1, wherein the mechanical oscillator comprises one element of a capacitor, such that said motion of said oscillator changes the capacitance of the said capacitor, and wherein the means for detecting the oscillation of the mechanical oscillator comprises means for detecting said change in capacitance.

22. The system of claim 1, wherein the quality factor of said mechanical oscillator is controlled by an external electronic circuit.

* * * * *

UNITED STATES PATENT AND TRADEMARK OFFICE
CERTIFICATE OF CORRECTION

PATENT NO. : 5,166,615
DATED : November 24, 1992
INVENTOR(S) : J. A. Sidles

Page 1 of 4

It is certified that error appears in the above-identified patent and that said Letters Patent is hereby corrected as shown below:

| COLUMN | LINE | |
|---|---|---|
| 2 | 19 | "known" should read --know-- |
| 2 | 49 | "not" should read --nor-- |
| 2 | 49 | "wheat" should read --what-- |
| 3 | 12 | "oscillator" (second occurrence) should read --oscillate-- |
| 4 | 11 | "magnetic" should read --magnitude-- |
| 4 | 34 | "that" should read --the-- |
| 4 | 47 | "at" should read --as-- |
| 5 | 13 | after "oscillator" insert --44-- |
| 5 | 56 | "pulses" should read --pulse-- |
| 6 | 6 | "summarizes" should read --summarize-- |
| 6 (Equation (5)) | 44 | "$\beta^2 \langle n \rangle = \varepsilon^2 + \varepsilon_{crit}^2 + \varepsilon^2 - [(\varepsilon^2 + \varepsilon_{crit}^2 + \varepsilon^2)^2 - 4\varepsilon^2 \varepsilon_{crit}^2]^{\frac{1}{2}}$" should read --$\beta^2 \langle n \rangle = \varepsilon^2 + \varepsilon_{crit}^2 + \delta^2 - [(\varepsilon^2 + \varepsilon_{crit}^2 + \delta^2)^2 - 4\varepsilon^2 \varepsilon_{crit}^2]^{\frac{1}{2}}$-- |
| 8 (Equation (10)) | 17 | "$\phi = B_0[z + (x^2 - y^2)/2L + (1_z^3 - zx^2 - zy^2)/2L^2]$" should read --$\phi = B_0[z + (x^2 - y^2)/2L + (\frac{2}{3}z^3 - zx^2 - zy^2)/2L^2]$-- |
| 8 | 24 | "correction" should read --corrective-- |
| 8 | 63 | "[4 ." should read --[4].-- |
| 9 | 16 | after "specifically" insert --by-- |
| 10 | 65 | "$\vec{a}(t) = \vec{a_0} + A \cos(\omega t) m$" should read --$\vec{a}(t) \equiv \vec{a_o} + A \cos(\omega t) \hat{m}$-- |
| 10 | 66 | "m" should read --$\hat{m}$-- |

UNITED STATES PATENT AND TRADEMARK OFFICE
CERTIFICATE OF CORRECTION

PATENT NO. : 5,166,615

DATED : November 24, 1992

INVENTOR(S) : J. A. Sidles

It is certified that error appears in the above-identified patent and that said Letters Patent is hereby corrected as shown below:

| | | |
|---|---|---|
| 10 | 67 | "$\vec{x}(t) = \vec{x_0} + X(t) \, n$" should read --$\vec{x}(t) \equiv \vec{x_0} + X(t) \, \hat{n}$-- |
| 10 | 68 | "n" should read --$\hat{n}$-- |
| 11 (Equation (14)) | 4 | " " should read --$\vec{B} = \vec{B_c} + A \, G \cdot \hat{m} \cos(\omega t) - X(t) \, G \cdot \hat{n}$-- |
| 11 | 18 | "an" should read --any-- |
| 11 (Equation (18)) | 48 & 49 | "$\beta^2 \langle n \rangle = \varepsilon^2 + \varepsilon_{crit}^2 + \delta^2 - [(\varepsilon^2 + \varepsilon_{crit}^2 + \delta^2)^2 - 4\varepsilon^2 \varepsilon_{crit}^2]^{\frac{1}{2}}$" should read --$\beta^2 \langle n \rangle = \varepsilon^2 + \varepsilon^2_{crit} + \delta^2 - [(\varepsilon^2 + \varepsilon^2_{crit} + \delta^2)^2 - 4\varepsilon^2 \varepsilon^2_{crit}]^{\frac{1}{2}}$-- |
| 12 | 51 | "$13 \equiv \varepsilon$" should read --$1 \pm \varepsilon$-- |
| 12 | 56 | "i" should read --is-- |
| 13 | 4 | "12of" should read --12 of-- |
| 13 | 7 | "$\langle n \rangle = \frac{1}{2} ]9, 10]$" should read --$\langle n \rangle = \frac{1}{2}[9, 10]$-- |
| 13 | 31 | "$\langle n \rangle \rangle = 2\varepsilon^2 / \beta^2$" should read --$\langle n \rangle = 2\varepsilon^2 / \beta^2$-- |
| 13 | 46 | "$\sim 4.19^{10} \Omega$," should read --$\sim 4.10^{10} \Omega$,-- |
| 13 | 53 | "$V_{signal} \approx 3.19^{13}$ (Volts/Watt) $W_{max}$" should read --$V_{signal} \approx 3 \cdot 10^{13}$ (Volts/Watt) $W_{max}$-- |
| 14 | 50 | after "is" insert --analogous to the goal of low-noise detection of the vibratory motion-- |
| 15 | 65 | "Random" should read --Radon-- |
| 16 | 12 | "transistions" should read --transitions-- |
| 16 | 33 | "eignestates" should read --eigenstates-- |

UNITED STATES PATENT AND TRADEMARK OFFICE
CERTIFICATE OF CORRECTION

PATENT NO. : 5,166,615

DATED : November 24, 1992

INVENTOR(S) : J. A. Sidles

It is certified that error appears in the above-identified patent and that said Letters Patent is hereby corrected as shown below:

| | | |
|---|---|---|
| 17 | 35 | "2.675.19$^8$" should read --2.675.10$^8$-- |
| 17 | 63 | "stars" should read --starts-- |
| 17 | 64 | "$\langle \vec{\sigma}\,\text{par}\rangle = \kappa\vec{\Omega}$" should read --$\langle \vec{\sigma}\,\text{par}\rangle = \kappa\hat{\Omega}$-- |
| 17 | 64 | "$\langle \vec{\sigma}\,\text{par}\rangle = \kappa\vec{\Omega}$" should read --$\langle \vec{\sigma}\,\text{par}\rangle = \kappa\hat{\Omega}$-- |
| 18 | 2 | "$\langle\vec{\sigma}\rangle \approx \langle\vec{\sigma}_{\text{par}}\rangle \approx \kappa\vec{\Omega}$" should read --$\langle\vec{\sigma}\rangle \approx \langle\vec{\sigma}_{\text{par}}\rangle \approx \kappa\hat{\Omega}$-- |
| 18 | 8 | "$\hat{x} - x$" should read --$\hat{x} - \hat{y}$-- |
| 18 | 13 | "$\langle n \rangle = 800,$" should read --$\langle n \rangle \approx 800,$-- |
| 18 | 28 | "operates" should read --operators-- |
| 18 | 51 & 52 | "asymp-totimically" should read --asymptotically-- |
| 18 | 57 | "eignestates" should read --eigenstates-- |
| 19 | 4 | "eignefrequencies" should read --eigenfrequencies-- |
| 19 | 27 | "Y-axis)" should read --Y-axis-- |
| 19 | 37 | "$\rangle n\rangle = 4\varepsilon^2/\beta^2$" should read --$\langle n\rangle = 4\varepsilon^2/\beta^2$ |
| 20 (Equation (35)) | 20 | "$\dfrac{d\Omega}{dt} = \dfrac{\beta^2}{8}\kappa\hat{z}\times\hat{\Omega} - \dfrac{1}{2Q}[\vec{\Omega} - \vec{\Omega}_0\,]$" should read --$\dfrac{d\bar{\Omega}}{dt} = \dfrac{\beta^2}{8}\kappa\hat{z}\times\hat{\Omega} - \dfrac{1}{2Q}[\vec{\Omega} - \vec{\Omega}_0\,]$-- |

UNITED STATES PATENT AND TRADEMARK OFFICE
CERTIFICATE OF CORRECTION

PATENT NO. : 5,166,615
DATED : November 24, 1992
INVENTOR(S) : J. A. Sidles

It is certified that error appears in the above-identified patent and that said Letters Patent is hereby corrected as shown below:

| | | |
|---|---|---|
| 20 (Equation (36)) | 34 | "$\beta^2 \langle n \rangle = \varepsilon^2 + \varepsilon_{crit}^2 + \delta^2 - [(\varepsilon^2 + \varepsilon_{crit}^2 + \delta^2)^2 - 4\varepsilon^2 \varepsilon_{crit}^2)^{\frac{1}{2}}$" should read --$\beta^2 \langle n \rangle = \varepsilon^2 + \varepsilon^2_{crit} + \delta^2 - [(\varepsilon^2 + \varepsilon^2_{crit} + \delta^2)^2 - 4\varepsilon^2 \varepsilon^2_{crit}]^{\frac{1}{2}}$-- |
| 21 | 19 | delete "of" (second occurrence) |
| 21 | 23 | "knownledge along" should read --knowledge -- |
| 21 | 28 | "fine a" should read --find-- |
| 21 | 39 | "DMA" should read "DNA" |
| 22 | 42 | "Brittancia" should read --*Brittanica*-- |
| 22 | 49 | "17for" should read --17 for-- |
| 24 (Table 1, #13, Design #2) | 6 | "$7.36.10^{-3} \overset{\circ}{A}$" (second occurrence) should read --$7.36.10^{-5} \overset{\circ}{A}$-- |

Signed and Sealed this

Thirtieth Day of November, 1993

Attest:

BRUCE LEHMAN

Attesting Officer    Commissioner of Patents and Trademarks